United States Patent [19]
Schultz et al.

[11] Patent Number: 6,058,489
[45] Date of Patent: May 2, 2000

[54] ON-LINE DISK ARRAY RECONFIGURATION

[75] Inventors: Stephen M. Schultz, Houston; Mark J. Thompson, Spring, both of Tex.

[73] Assignee: Compaq Computer Corporation, Houston, Tex.

[21] Appl. No.: 09/137,801

[22] Filed: Aug. 20, 1998

Related U.S. Application Data

[63] Continuation of application No. 08/542,897, Oct. 13, 1995, Pat. No. 5,809,224.

[51] Int. Cl.⁷ .................................................. G06F 11/00
[52] U.S. Cl. .................................................. 714/7
[58] Field of Search ....................... 714/7, 2, 3; 364/245, 364/245.2, 245.31

[56] References Cited

U.S. PATENT DOCUMENTS

| | | | |
|---|---|---|---|
| 5,574,851 | 11/1996 | Rathunde | 714/7 |
| 5,790,775 | 8/1998 | Marks et al. | 714/7 |
| 5,809,224 | 9/1998 | Schultz et al. | 714/7 |
| 5,822,782 | 10/1998 | Humlicek et al. | 711/114 |
| 5,864,653 | 1/1999 | Tavallaci et al. | 714/7 |

FOREIGN PATENT DOCUMENTS

| | | |
|---|---|---|
| 0482819 A2 | 4/1992 | European Pat. Off. . |
| 0485110 A2 | 5/1992 | European Pat. Off. . |
| 0654736 A2 | 5/1995 | European Pat. Off. . |

OTHER PUBLICATIONS

David A. Patterson, Garth Gibson, and Randy H. Katz., A Case for Redundant Arrays of Inexpensive Disks (RAID), Dec. 1987, pp. 1–24, Report No. UCB/CSD 87/391.

*Primary Examiner*—Robert W. Beausoliel, Jr.
*Assistant Examiner*—Pierre E. Elisca
*Attorney, Agent, or Firm*—Akin, Gump, Strauss, Hauer & Feld, LLP

[57] ABSTRACT

A system for performing on-line reconfiguration of a disk array in which a source logical volume is reconfigured to a destination logical volume. Disk array configuration is invoked if a new physical drive is inserted, or a drive is removed. Reconfiguration can also be performed if the user desires to change the configuration of a particular logical volume, such as its stripe size. The disk array reconfiguration is run as a background task by firmware on a disk controller board. The reconfigure task first moves data from the source logical volume to a posting memory such as RAM memory. The reconfigure task operates one stripe at a time, with the stripe size being that of the destination logical volume. Once a stripe of data is moved into the posting memory, it is written back to corresponding locations in the destination logical volume. The reconfigure task continues until all data in the source logical volume have been moved into the destination logical volume. While the reconfigure task is working on a particular logical volume, data remains accessible to host write and read requests.

10 Claims, 16 Drawing Sheets

|  | | | |
|---|---|---|---|
| 2F | 1F | 0F | 2E |
| 1E | 0E | 2D | 1D |
| 0D | 2C | 1C | 0C |
| 2B | 1B | 0B | 0A |

DRIVE: 1 2 3 4

VOLUME H (spans all rows on left)

FIG. 2G

| | | |
|---|---|---|
| 2F | 1F | 0F |
| 2E | 1E | 0E |
| 2D | 1D | 0D |
| 2C | 1C | 0C |
| 2B | 1B | 0B |
| 0A | | |

DRIVE: 1 2 3

VOLUME H (spans all rows on left)

FIG. 2H

ON-LINE DISK ARRAY RECONFIGURATION

This application is a continuation of application Ser. No. 08/542,897, filed on Oct. 13, 1995, now U.S. Pat. No. 5,809,224 incorporated herein by reference.

BACKGROUND OF THE INVENTION

1. Field of the Invention

The invention relates to disk array controllers, and more particularly, to disk array controllers that perform on-line reconfiguration of a disk array.

2. Description of the Related Art

With the proliferation of low cost personal computers, local area networks (LANs) have become very popular as a communications networks that connect to a large number of personal computers or workstations. A LAN typically includes one or more file servers, which act as storage hubs for data, with copies of the data being transferred to the workstations on demand and updated data being returned for storage. In many applications, the data on the file servers must be made accessible on a continuous basis. If a file server is taken "off-line" for any reason, the data on the file server would become temporarily unavailable, which may disrupt business operations.

To achieve the optimal price/performance ratio file servers are implemented with a collection of relatively smaller and inexpensive hard disk drives. However, with the increased number of disk drives used, the failure rate increases dramatically. Several solutions to the data failure problem are available. The simplest solution is to provide completely redundant disk drives, which is referred to as mirroring. One problem with mirroring is storage efficiency, as one half of the available capacity is used for redundancy. Other more efficient solutions have been proposed, such as those in David A. Patterson et al., "A Case for Redundant Arrays of Inexpensive Disks (RAID)," Report No. UCB/CSD 87/391 (1987). Various RAID protection schemes are described. The RAID 1 architecture refers to the traditional mirrored disk approach. In the RAID 4 architecture, parity disks are used for storing parity information which are used to check for errors in accessed data. The RAID 5 architecture is an improvement on the RAID 4 architecture, with the parity information distributed across all the disks to achieve greater parallelism.

As a user's data storage requirements increase, the total storage capacity on the LAN must be increased. One method of increasing storage capacity on the LAN is by connecting a new file server to the LAN. However, this is a relatively expensive solution, as an entire file server must be purchased. An alternative method of increasing storage capacity is by adding hard disk drives to an existing file server system. Normally, the hard disk drives of a file server system are arranged in logical volumes. Presently, to avoid taking a file server off-line in a LAN, a newly added hard disk drive is configured as a new, distinct volume because it cannot simply be added to the array configuration in a RAID4 or RAID5 configuration because the network operating systems cannot handle on-line logical volume size changes. Therefore, the new drive or drives cannot be added to the existing array and if a fault tolerance scheme for the new drive or drives is to be used, a new logical volume is defined and some of the new logical drives in the new volume would have to be used for redundancy purposes. The newly added redundant drives do not add to the total storage capacity of the file server, thereby decreasing efficiency.

An alternative method of adding a drive to an array configured as a RAID4 or RAID5 array is to use a backup-reconfigure-restore process. This allows newly-added hard disk drives to form a larger logical volume. The process requires taking the file server off-line, backing up the data stored on existing hard disk drives onto tape, reconfiguring the physical disk drives, including the new disk drives, into a new logical volume, restoring data from the tape back onto the reconfigured logical volumes and placing the file server back on-line. One major disadvantage of the backup-reconfigure-restore process is that the file server must be taken off-line, thereby rendering the data on the file server unavailable. Another disadvantage is that the backup-reconfigure-restore process requires a large amount of time to perform.

It is thus desired that a solution be developed to overcome the problems encountered in adding a disk drive or drives to an existing RAID4 or RAID5 array so that the drives could be added while the file server is on-line.

In the ensuing description of the preferred embodiment of the present invention, the terminology used is defined as follows. When a disk array is reconfigured by either adding a disk drive or removing one, data in the disk array is rearranged. A source logical volume is reconfigured to a destination logical volume, i.e., data in the source logical volume is transferred to the destination logical volume. Thus, the source logical volume refers to the logical volume defined on the original set of drives. The destination logical volume refers to the logical volume defined on the new set of disk drives. Disk array reconfiguration refers to the process of changing the number of drives allocated to an existing logical volume while keeping the logical volume size unchanged. Disk array expansion is a subset of disk array reconfiguration and refers to the process of adding a new drive or drives to an existing disk array. A new logical volume refers to the logical volume created in the excess space resulting from adding drives to the existing disk array. It is also noted that more than one logical volume can be present in a given disk array.

SUMMARY OF THE PRESENT INVENTION

A disk controller according to the present invention performs on-line reconfiguration of RAID 1, RAID 4 or RAID 5 disk arrays in a hard disk drive system. Expansion of the disk array may be needed when a new physical drive is added to the system. In a departure from prior art systems, the disk controller according to the present invention performs the disk array expansion while the system is on-line, that is, stored data remains available from the hard disk drives for host read or write cycles. Basically the new disk array is redefined to form the prior logical volume and new logical volume, the new logical volume being formed in the excess space resulting from the addition of the new disk drives. But both of these logical volumes are spread across the increased disk array. In the expansion process in which data in the prior logical volume is spread over the new set of disk drives, the prior logical volume starts as a source logical volume and is reconfigured to a destination logical volume, i.e., data in the source logical volume is moved to data in the destination logical volume. The configuration parameters of the source logical volume also differ from the parameters of the destination logical volume, including the parameters that represent the number of disk drives in the volume, the stripe size, fault tolerance mode, and other parameters.

In addition, when a disk drive is to be removed from a disk array, disk array reconfiguration is possible if free space is available to allocate the logical volume over the remaining disk drives. The amount of free space available must be at least equal to the amount of data in the logical volume stored on the disk drive to be removed.

The disk controller of the preferred embodiment includes a posting cache. One region of the posting cache is allocated to perform the reconfiguration. Preferably, reconfiguration is performed one stripe at a time, with the stripe size being that of the destination volume. Using configuration information of the source logical volume, one stripe of data is transferred to the allocated region in the posting cache. Then, using the configuration information of the destination logical volume, the stripe of data is transferred from the posting cache to the new disk array. The process is repeated until all existing data in the source logical volume has been transferred to the destination logical volume. While the reconfigure process is in progress, read and write requests from the host computer system are handled by the disk controller, which performs a check to determine if the request is to blocks that have already been reconfigured. If so, the read or write request is performed using the destination logical volume configuration information. If the accessed blocks have not yet been reconfigured, the source logical volume configuration information is used to perform the request. A request may also span blocks that have not yet been reconfigured and those that have been reconfigured. In those instances, the host request is suspended until the disk array reconfiguration process is able to catch up.

When an expansion is completed, a new logical volume is created from the end portion of each drive in the drive array, forming a new logical volume defined in the excess space resulting from the addition of the new disk drive. This new logical volume is indicated to the network operating system and is mounted as a new volume.

BRIEF DESCRIPTION OF THE DRAWINGS

A better understanding of the present invention can be obtained when the following detailed description of the preferred embodiment is considered in conjunction with the following drawings, in which:

FIGS. 2A–2H illustrate disk array reconfiguration operations performed by the disk controller board of FIG. 1 according to the preferred embodiment of the present invention;

DETAILED DESCRIPTION OF THE PREFERRED EMBODIMENT

Figure 1:
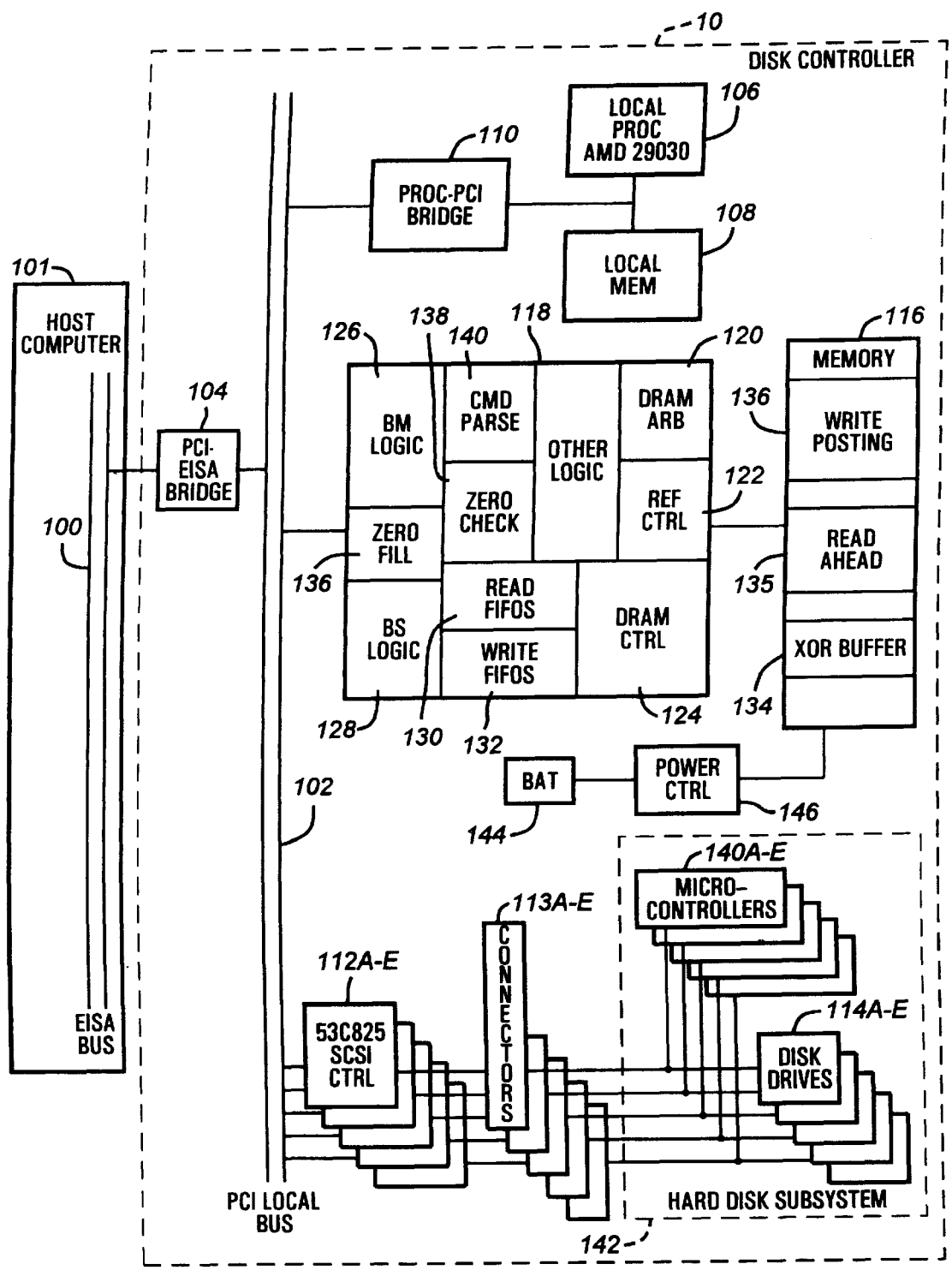
FIG. 1 is a block diagram of a disk controller board according to the present invention.

Referring now to FIG. 1, a block diagram of the disk controller 10 according to the present invention is shown.

The disk controller board 10 is connected either to an EISA bus or a PCI bus 100, which is contained in and provides the communications channel to the other components of a host computer system 101. For purposes of the remaining discussion, an EISA bus 100 will be used. The disk controller board 10 includes a PCI local bus 102, which includes a control portion and a multiplexed address and data portion. For a description of the PCI bus standard, refer to *PCI Specification, Revision* 2.0, Intel Corporation (April, 1993), which is hereby incorporated by reference.

A PCI-EISA bridge 104 is connected between the EISA bus 100 and the PCI local bus 102. If, however, a PCI bus 100 is used instead, then a PCI-PCI bridge 104 would be used. The PCI-EISA bridge 104 is both a master and slave device on both the PCI bus 102 and the EISA bus 100 and functions as a buffer, a translation unit and a PCI arbiter. The bridge 104 contains a number of FIFOs for optimizing data transfers from EISA slaves to PCI bus masters. On the EISA side, data transfers are controlled by the bridge EISA bus master. On the PCI side, data transfers are handled by the PCI slave logic. Each PCI bus master communicating with the bridge 104 is allocated a FIFO. Therefore, a PCI master could be reading from one FIFO while a FIFO for another PCI master is being written by the bridge EISA bus master. During a disk read operation, a PCI master will write data into the bridge FIFO for subsequent retrieval by the bridge EISA bus master controller. During a disk write operation, a PCI master will read data from host memory and the bridge EISA bus master controller will read ahead to keep the FIFOs filled, thus enabling long burst reads. More detail on the operation of the FIFOs is provided in patent application Ser. No. 08/542,711, entitled "Read-Ahead FIFO with LRU Replacement Policy," filed concurrently herewith and hereby incorporated by reference. The bridge 104 also contains logic for translating interrupts from the PCI bus to the EISA bus and masking the interrupts until data clears the FIFOs.

The disk controller board 10 also includes a local processor 106, preferably an AMD 29030 processor, that controls the functions of the disk controller board 10. The local processor 106 is connected to a local memory 108, and both the local processor 106 and local memory 108 are connected through a processor-PCI bridge 110 to the PCI local bus 102. The local processor 106 executes firmware stored in the local memory 108 to perform various disk controller functions.

Preferably, the processor-PCI bridge 110 is implemented with an ASIC. The processor-PCI bridge 110 includes logic for converting processor memory or I/O cycles into PCI cycles, as well as processor-to-PCI write posting buffers. The bridge 110 also includes a DRAM controller for controlling operations to the local memory 108. Additionally, interval timers and an interrupt controller are included in the bridge 110.

Also connected to the PCI local bus 102 are a plurality of SCSI controllers 112A–E for interfacing a disk array subsystem 142 that includes a plurality of hard disk drives. The preferred embodiment is configurable to include up to 5 SCSI controllers 112A–E, which are preferably 53C825 PCI-SCSI I/O processors from NCR Corporation. For a full description of the 53C825 SCSI controller, refer to *NCR 53C825 PCI-SCSI I/O Processor With Local ROM Interface. Data Manual,* NCR Corp. (1993).

Each of the SCSI controllers 112A–E are connected to one of five sets of disk drives 114A–E through connectors 113A–E. Each SCSI controller 112 is preferably capable of being connected to five internal SCSI hard disk drives or seven external SCSI hard disk drives. Each set of drives 114A–E is associated with a microcontroller 140A, B, C, D or E. The microcontrollers 140A–E are preferably implemented with the 8051 processor from Intel Corp. The microcontrollers 140A–E provide certain miscellaneous control functions for each set of drives, such as driving status LEDs and performing temperature monitoring. For an exemplary microcontroller, see patent application Ser. No. 07/955,669, entitled "Method of Communicating with a SCSI Bus Device That Does Not Have an Assigned SCSI Address," filed Oct. 2, 1992, and hereby incorporated by reference. Communications between the SCSI controllers 112A–E and the physical drives 114A–E are accomplished via SCSI buses.

Requests issued by the host computer system are transmitted to the processor-PCI bridge 110. Pointers are written into the processor-PCI bridge 110, which responds by retrieving the commands from the location in host memory specified by the pointers. The processor-PCI bridge 110 then interrupts the local processor to indicate that host requests are available. In response, the local processor 106 builds a command list to perform the requested commands. Depending on the type of operation, the local processor 106 sends command description blocks (CDBs) to the DRAM interface 118 or one of the SCSI controllers 110A–E. In response, the DRAM interface 118 or SCSI controller 110 obtains control of the PCI bus 102 to perform the requested operation.

A posting memory 116, preferably implemented with DRAM chips, is used as a posted write buffer for the host computer system, as well as a read ahead cache. The DRAM 116 is connected via a memory data bus MD, memory controller bus MC, and memory address bus MA to a DRAM interface 118, which is in turn connected to the PCI local bus 102. Preferably, the DRAM 116 is configurable to store up to 64 Mbytes of data. By posting writes in the DRAM 116, latencies associated with writing data to the hard disk subsystem 142 are avoided, which improves data transfer throughput. To prevent loss of data in case of power failure, portions of the DRAM 116 are battery backed. Battery backing is necessary as the host computer system has already assumed that the data has been permanently stored in the hard disk drives 114A–E. By battery-backing the DRAM 116, data can be recovered from the DRAM 116 after power is restored to the computer system. Backup power is provided by a power control circuit 146 connected to lithium batteries 144. When power from the host computer system is lost, the power control circuit 146 switches the power supply voltage inputs of the DRAM 116 to the batteries 144. The read ahead caching allows improved performance when sequential operations are occurring. More details on the read ahead caching are provided in patent application Ser. No. 08/543,067 entitled "Adaptive Read-Ahead Disk Cache," filed concurrently herewith, which is hereby incorporated by reference.

The DRAM interface 118 supports various configurations of the DRAM 116. Preferably, the DRAM 116 has a maximum capacity of 64 Mbytes, with the DRAM interface 118 being allocated 128 Mbytes, half of which is the normal address range and the other half of which is the XOR address range. The width of the memory data bus MD between the DRAM interface 118 and the DRAM 116 is selectable to either 32 bits or 64 bits. In addition, up to four banks of memory can be used. Preferably, three types of memory chips are used: 256K×18 DRAM chips for supporting up to 512K bytes of memory capacity; 512×8 or ×9 DRAM chips for supporting a total DRAM capacity of 1, 2, 4, 8, 16 or 32 Mbytes; and 2M×8 DRAM chips for supporting a total memory capacity of 16, 32, 48 or 64 Mbytes. The DRAM interface 118 is configurable to either perform 8-bit error detection and correction (ECC) or parity protection of DRAM data.

For the configurations using the 256K×18 DRAM chips or 512K×8 or ×9 DRAM chips, address bit 24 distinguishes between the normal address range and the XOR address range. The XOR address range is selected if address bit 24 is set high. In the DRAM configurations using 2M×8 DRAM chips, address bit 26 distinguishes between read-modify-write XOR operation and normal write operation.

The DRAM 116 can be subdivided into a plurality of portions, including a write posting cache 136, a read ahead cache 135 and an XOR buffer 134 for storing data for cumulatively developing parity information and for other tasks. The write posting cache 136 receives write posting data during host computer system writes to the hard disk subsystem 142. The write posting cache 136 can also be allocated to store data associated with certain background tasks, such as a rebuild process and a reconfigure process. The rebuild process is invoked to restore data to a replacement drive. The rebuild process is described in greater detail in patent application Ser. No. 08/543,011 entitled "Read Checking for Drive Rebuild," which is filed concurrently herewith and which is hereby incorporated by reference.

In the preferred embodiment, the write posting cache 136 is allocated a transfer buffer region for performing the disk array reconfiguration process, as well as a configuration area for storing the progress information of the reconfiguration process. As the write posting cache 136 is battery-backed, storing the progress information allows the reconfiguration process to be resumed without data loss after a power failure occurs.

Status information regarding the data stored in the write posting cache 136 is stored in the local memory 108. The status information includes a tag, which stores the upper address bits of the data in each cache line as well as information indicating if the cached data is clean or dirty and valid or invalid. The status information further includes information regarding whether the line is locked and the reason for the lock. A line is locked when it is currently being flushed to the disk array 142 or is waiting to receive data from the host. A line can also be locked by other tasks.

Other types of status information in the local memory 108 include the destination of the cached data line, including the logical volume, the drive, and the location in the respective drive. A low priority software task continually scans the status information in the local memory 108 to determine if a line of data contains dirty data and to flush data to the drive array subsystem 142.

The DRAM interface 118 includes a PCI bus master 126 and a PCI bus slave 128. In addition, the DRAM interface 118 includes a DRAM controller 124 for controlling accesses to the DRAM 116, as well as a refresh controller 122 for performing refresh cycles. In the preferred embodiment, the refresh controller 122 runs CAS-before-RAS (CBR) refresh cycles. A DRAM arbiter 120 is also included that arbitrates requests for the DRAM 116 from the various possible requesters in the DRAM interface 118.

The PCI bus slave 128 allows any PCI master, other than the PCI bus master 126 in the DRAM interface 118, to place data directly into the DRAM 116. To improve performance, a set of 5 internal read ahead FIFOs 130 are associated with the PCI bus slave 128, each FIFO having a depth of 8 double words, which is the maximum length of a burst cycle performed by a PCI bus master on the PCI local bus 102. FIFO selection is controlled by a least recently used (LRU) algorithm, which selects the FIFO least recently used. This algorithm is described in more detail in patent application Ser. No. 08/542,711, entitled "Read-Ahead FIFO with LRU Replacement Policy," referenced above. Logic for maintaining coherency of the data in the FIFOs 130 is also included. If there is a hit to data located in a particular FIFO, the FIFO selected will be that containing the requested data. The PCI bus slave channel 128 is also associated with a write FIFO 132, which allows posting of writes to the bus slave of up to 8 double words. Use of the write FIFO 132 overcomes the latencies associated with writing data directly into the DRAM 116.

The DRAM arbiter 120 controls all requests to the DRAM 116. In the preferred embodiment, refresh requests are stacked two deep. If two requests are pending, then the CBR refresh request has preemptive priority over any other request for the DRAM 116. A request from the bus slave write FIFO 132 has the next highest priority, followed by a request from the read FIFO bank 130.

The PCI bus master 126 supports three hardware commands essential for drive array operations. The first is a memory-to-memory move, which transfers data from main computer system memory (not shown) to the write posting cache 136 during write posting operations. Additionally, on cache hits to previously posted or read ahead data still residing in the write posting cache 136 or read ahead cache 135, the PCI bus master 126 is programmed to move the data in the write posting cache 136 to system memory. Further, the PCI bus master 126 is also capable of moving data located entirely in the DRAM 116. For example, the internal move may be a transfer of data between the write posting cache 136 and the XOR buffer 134.

The second operation supported by the PCI bus master 126 is a zero fill function, which is used to initialize specified portions of the XOR buffer 134 to all zeros. The zero fill operation is controlled by a zero fill block 136. In addition, the PCI bus master 126 supports a zero detect operation, which is used to check disk data integrity of redundant drives. To that end, a zero check block 138 is provided in the DRAM interface 118.

Operations of the PCI bus master 126 in the DRAM interface 118 are controlled by command descriptor blocks (CDB). Software being executed by the local processor 106 places a CDB in a memory location that is accessible by the PCI bus master 126. Pointers to the CDBs are placed in a command pointer FIFO located in the DRAM interface 118 to initiate operation by the bus master 126. The bus master 126 retrieves the CDB pointers from the command pointer FIFO in the order they are stored, fetches the CDB from the memory location specified and executes the command contained in the CDB. Upon completion of the command, the bus master 126 transfers the CDB pointer for the completed command from the command pointer FIFO to a completion status FIFO. The local processor 106 can be notified by interrupt or through polling that either a completion is pending or that the bus master 126 can accept more CDB pointers. To parse the retrieved CDB commands, a command parser block 140 is provided in the DRAM interface 118. As the command parse operation may require access to the DRAM 116, the command parser block 140 is a potential requestor which must be granted access by the DRAM arbiter 120 before it can begin operation.

As described above, the top three priorities for accesses to the DRAM 116 belong to the CBR refresh request, a request from the posted bus slave write FIFO 132, and a request from the read FIFO bank 130. The priorities of the remaining requests are as follows, in descending order: zero check operation, an external-to-internal memory write operation, an internal-to-internal memory read operation, an internal-to-internal memory write operation, a zero fill operation, a command parse operation, and an internal-to-external memory read operation.

Figures 2A, 2B, 2C, 2D, 2E, 2F:
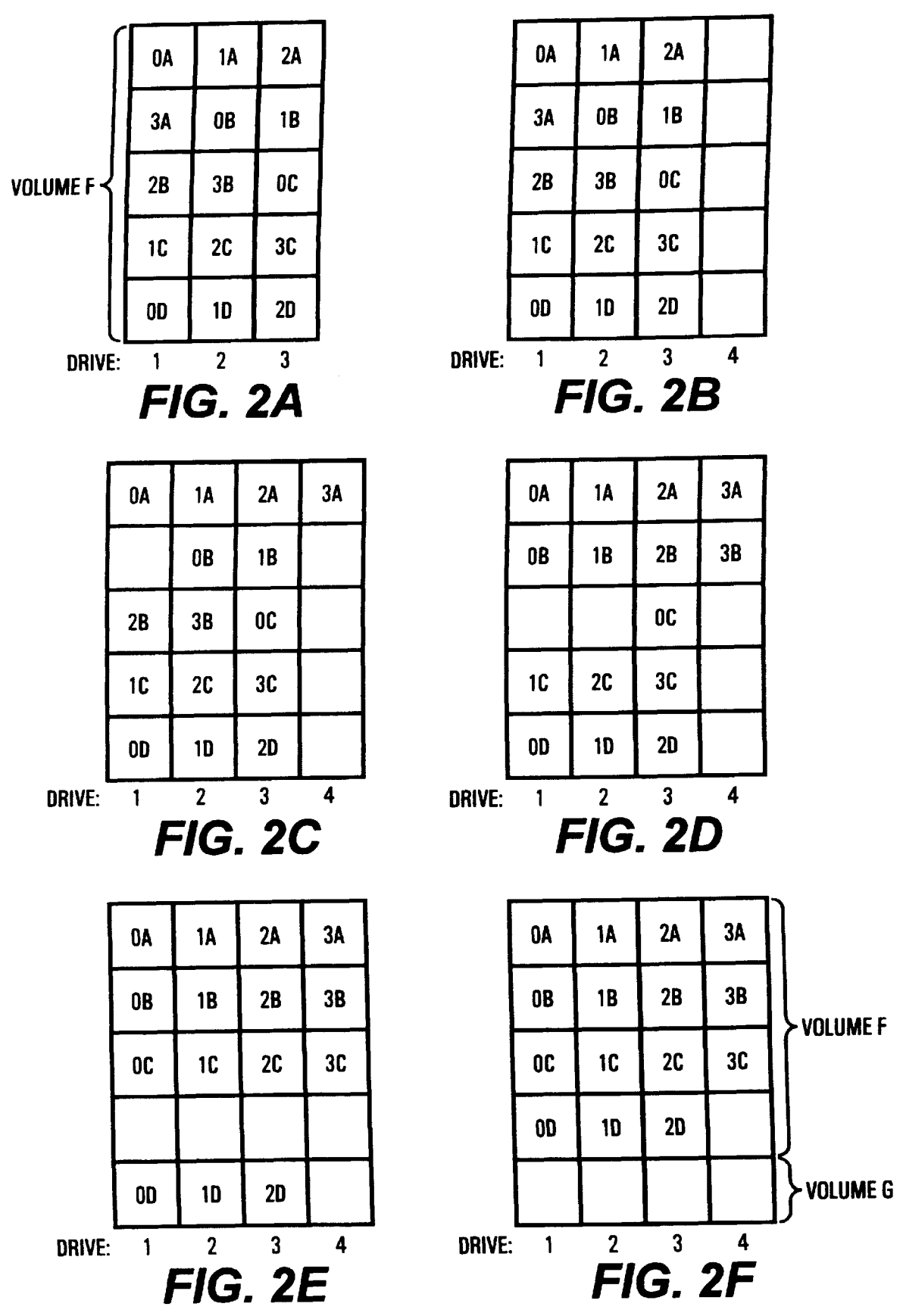

The disk controller board 10 according to the present invention is capable of performing disk array reconfiguration, i.e., a logical volume developed on a given disk array configuration (source logical volume) can be reconfigured to a logical volume on a differing number of disk drives forming the array (destination logical volume) while data remains available for host requests, such as read and write requests for data in the disk subsystem 142. To best illustrate the transfers performed by an EXPAND task for expanding the disk array by adding a disk drive, reference is now made to FIGS. 2A–2E, which illustrate the data flow from the source logical volume to the destination logical volume. FIG. 2A illustrates source logical volume F. Each row represents a stripe, and each column represents a physical drive. Each box in a row represents a striping unit consisting of a predetermined number of sectors. Parity information is not shown for simplicity. FIGS. 2B–2F show the intermediate steps of a disk array expansion process, with FIG. 2F illustrating destination logical volume F and a new logical volume G. For this example, it is assumed that the stripe size of the destination logical volume is greater than the stripe size of the source logical volume. Also, for simplicity, the volume size of logical volume F is assumed to be small, and the striping unit size of the destination logical volume is assumed to be equal to the striping unit size of the source logical volume. The EXPAND task is performed one full stripe (of the destination volume) at a time.

FIG. 2B illustrates a new disk drive being added to the disk array. FIG. 2C shows that one full stripe, consisting of striping units 0A, 1A, 2A and 3A, is transferred from the source logical volume F to the destination logical volume F. The stripe is first read from the source logical volume F and placed into the allocated expand buffer in the write posting cache 136. The data is then written back from the write posting cache 136 into the destination logical volume F. FIG. 2D illustrates the transfer of the next stripe, consisting of units 0B, 1B, 2B and 3B, from the source logical volume to the destination logical volume. Next, FIG. 2E illustrates the transfer of the third stripe, which consists of striping units 0C, 1C, 2C and 4C. Finally, FIG. 2F illustrates the transfer of the remaining striping units in the source logical volume, which consist of units 0D, 1D and 2D. Thus, the final transfer by the EXPAND task is a partial stripe move from the source logical volume to the write posting cache 136 and back to the destination logical volume. Reconfiguration of the disk array has also resulted in excess space not used by logical volume F, as illustrated by the empty striping units on the bottom row. The excess space is configurable as a new logical volume G.

Rare cases may occur where the stripe size of the destination volume is specified as being less than the stripe size of the source volume. One example of that is shown in FIGS. 2G and 2H, with FIG. 2G illustrating source logical volume H and FIG. 2H illustrating destination logical volume H. In this scenario, the destination volume H has one less physical drive then the source logical volume H. Such disk array reconfiguration is possible only if disk drives 1, 2 and 3 have excess unused space. The amount of excess space needed must be equal at least the amount of data in source logical volume stored on disk drive 4. The EXPAND task starts at the last stripe and proceeds back to the first stripe. The first transfer involves only striping unit 0A, as the number of striping units in the destination volume is different from that of the source volume. Striping unit 0A is read into the posting cache 136 and then moved into the first stripe of the destination logical volume H. The remaining transfers involve full stripe transfers, beginning with the stripe consisting of units 0B, 1B and 2B and ending with the stripe consisting of units 0F, 1F and 2F.

The firmware running on the controller board 10 does not automatically start a reconfigure process whenever a new drive has been inserted or a drive has been removed. It is up to the user to request a disk array reconfigure process through software running on the host computer. Additionally, the user may desire to reconfigure a disk array even though the physical drive system is unchanged, e.g., allocating one less drive to a logical volume. In the preferred embodiment, software having a graphical user interface is used to display information about the disk controller board 10 in a Windows environment. Based on the information displayed, the user can program the software to issue commands to reconfigure the disk controller board 10. Some of the commands that can be issued by the host software are described below.

A command for retrieving information about the disk controller board 10 is the command SENSE BUS PARAMETERS. The command SENSE BUS PARAMETERS is targeted to a particular SCSI controller 112 to obtain information about that SCSI controller. One parameter that is retrievable via the SENSE BUS PARAMETERS command is the parameter HOT_PLUG_COUNT. Each word of the parameter HOT_PLUG_COUNT represents the SCSI ID of a physical hard disk drive connected to a bay corresponding to one SCSI controller 112. The parameter HOT_PLUG_COUNT is incremented each time a physical drive is added (hot-plugged) to the particular bay. The parameter HOT_PLUG_COUNT is incremented when a new drive has been added to the bay, a drive has failed and has been replaced, or the same drive has been removed and reinstalled. The parameter HOT_PLUG_COUNT is set to zero at power up.

Another parameter retrievable by the command SENSE BUS PARAMETERS is the parameter CONNECTION_INFO, which contains bits indicating whether external drives or internal drives are attached to the disk controller board 10.

The host software also includes a command SET CONTROLLER PARAMETERS for modifying parameters associated with the disk controller board 10. Two controller parameters are the REBUILD_PRIORITY and EXPAND_PRIORITY parameters for determining the priority of the background rebuild and reconfigure tasks, respectively, which are both selectable between the values of 0 and 255 in the preferred embodiment.

Another command that can be issued by the host software is the command SENSE LOGICAL DRIVE STATUS. This command determines if a logical drive, i.e., a logical volume, is in one of the following states: LOG_VOL_OK, indicating the volume is Ok; LOG_VOL_FAILED, indicating the volume has failed; LOG_VOL_NOT_CONFIGURED, indicating that the volume has not yet been configured; LOG_VOL_NEEDS_REBUILD, indicating that a failure has occurred that requires data to be recovered; LOG_VOL_REBUILDING, indicating that the volume is currently rebuilding; LOG_VOL_OVERHEATING, indicating that the hardware is overheating; LOG_VOL_OVERHEATED, indicating that the hardware has overheated; LOG_VOL_EXPANDING, indicating that a reconfigure task is currently in progress; LOG_VOL_NEEDS_EXPAND, indicating that a reconfigure request has been queued; and LOG_VOL_NOT_AVAILABLE, indicating that a logical volume is not available, such as when overlapping logical volumes are detected during a volume configuration operation. The command SENSE LOGICAL DRIVE STATUS also retrieves a map of failed physical disk drives associated with a particular logical volume.

The host software can also issue commands SET CONFIGURATION and CHANGE CONFIGURATION. The CHANGE CONFIGURATION command is used to change the configuration of an existing disk array. Thus, to reconfigure a disk array, the CHANGE CONFIGURATION command is issued to allocate the different number of disk drives to the logical volume. The SET CONFIGURATION command can also be used to perform the disk array reconfiguration. The difference between the SET CONFIGURATION and CHANGE CONFIGURATION commands is that data stored in the logical volume is lost if the SET CONFIGURATION command is issued, whereas the CHANGE CONFIGURATION command allows data to be saved.

The following describes some of configuration parameters that are issued with the SET CONFIGURATION and CHANGE CONFIGURATION commands. A parameter CONFIGURATION_SIGNATURE represents a signature that is unique for each logical volume. A parameter DATA_DISTRIBUTION_MODE determines the mapping scheme used between a logical request and a physical request, with the parameter set to the value 1 to specify direct mapping and to the value 2 to specify multiple block interleave mapping used with RAID 0 and 1 fault tolerance schemes. The direct mapping scheme uses only one physical drive if no fault tolerance is selected, and two physical drives if mirroring fault tolerance is selected. The multiple block interleave mapping scheme used with RAID 0 and 1 configurations breaks a logical request into physical requests directed to proper physical drives. If RAID 4 or 5 fault tolerance is used, then a parity mapper is used to route the data and parity information to the appropriate physical drives. The selected mapping scheme converts host logical requests into physical requests that are executed by the appropriate one of the SCSI controllers 112A–E.

A parameter CONTROLLER_PHYSICAL_DRIVE_COUNT specifies the total number of physical drives that are connected to the particular SCSI controller 112, including those installed in an external storage box. A parameter LOGICAL_UNIT_PHYSICAL_DRIVE_COUNT specifies the total number of physical drives that are assigned to the logical volume. If the parameter is set to the value zero, then the entire logical volume is deleted.

The fault tolerance mode of the specified logical volume is set by a parameter FAULT_TOLERANCE_MODE, with the value 0 indicating no fault tolerance is used, and the values 1, 2, and 3 indicating that the RAID 4, RAID 1 and RAID 5 protection schemes, respectively, are used. A parameter DISTRIBUTION_FACTOR represents the number of physical sectors in a striping unit. A stripe can span several physical drives, and a striping unit is that portion of the stripe located on a physical drive. A parameter SPARE_ASSIGNMENT_MAP designates physical drives that are to be used as on-line spares. A parameter OFFSET_TO_DATA specifies the offset into each physical drive in the drive array that is the starting location of a logical volume. For the reconfiguration operation, the value of OFFSET_TO_DATA for the destination logical does not necessarily have to be located in the source logical volume, as long as the OFFSET_TO_DATA value does not cause the destination volume to overlap another logical volume. A parameter BLOCKS_ON_VOLUME specifies the total number of usable sectors in a particular volume. A parameter BLOCKS_PER_DRIVE specifies the number of sectors the volume uses on each physical drive.

When a disk array is reconfigured, the parameters listed above may be specified to different values for the source logical volume and the destination logical volume. For example, the parameter LOGICAL_UNIT_PHYSICAL_DRIVE_COUNT is changed to a different value, with the value for the destination logical volume being greater than that of the source logical volume in an expand operation. The fault tolerance mode of the logical volume can also be changed by changing the parameter FAULT_TOLERANCE_MODE, with the source volume having one mode and the destination volume having another. The other volume parameters also can be adjusted as desired by the user.

The host software notifies the local processor 106 that a command list has been built in host memory by writing the address of the command list into a command pointer FIFO located in the processor-PCI bridge 110. Preferably, the command pointer FIFO is 16 words deep and 32 bits wide for holding up to 16 command list pointers. In response, the processor-PCI bridge 110 obtains control of the PCI local bus 102 to retrieve 8 double words from host memory starting at the location specified by the command list pointer. The 8 doublewords of the command list are stored in a command list FIFO. The processor-PCI bridge 110 then interrupts the local processor 106 to indicate that a command is available locally. The local processor 106 then invokes the proper interrupt service routine to move the command into the local memory 108. The interrupt service routine invokes a routine EXECUTE_LOGICAL_REQUEST (shown in FIGS. 7A and 7B) to determine which tasks are to be invoked in response to the host command.

The routine EXECUTE_LOGICAL_REQUEST is submitted with a pointer REQUEST that is the starting address of a data structure which includes a field UNIT to specify the logical volume to be accessed, a field COMMAND to specify the type of command to be performed, a STATUS field to indicate if the host command is successfully run, and fields indicating the starting sector number and the number of sectors involved in the current command. The routine EXECUTE_LOGICAL_REQUEST checks to determine if the parameter EXPAND_RUNNING is set true, which indicates that a reconfigure process is in progress. If so, the routine EXECUTE_LOGICAL_REQUEST invokes a routine PROCESS_EXPAND_REQUEST (shown in FIG. 8), which checks to determine if the requested sectors have been processed by the EXPAND task yet and to set the volume configuration parameters accordingly. In addition, if the SET CONFIGURATION or CHANGE CONFIGURATION commands are asserted, the routine EXECUTE_LOGICAL_REQUEST invokes a routine SET_CONFIGURATION to handle the reconfiguration task.

Figure 3A:
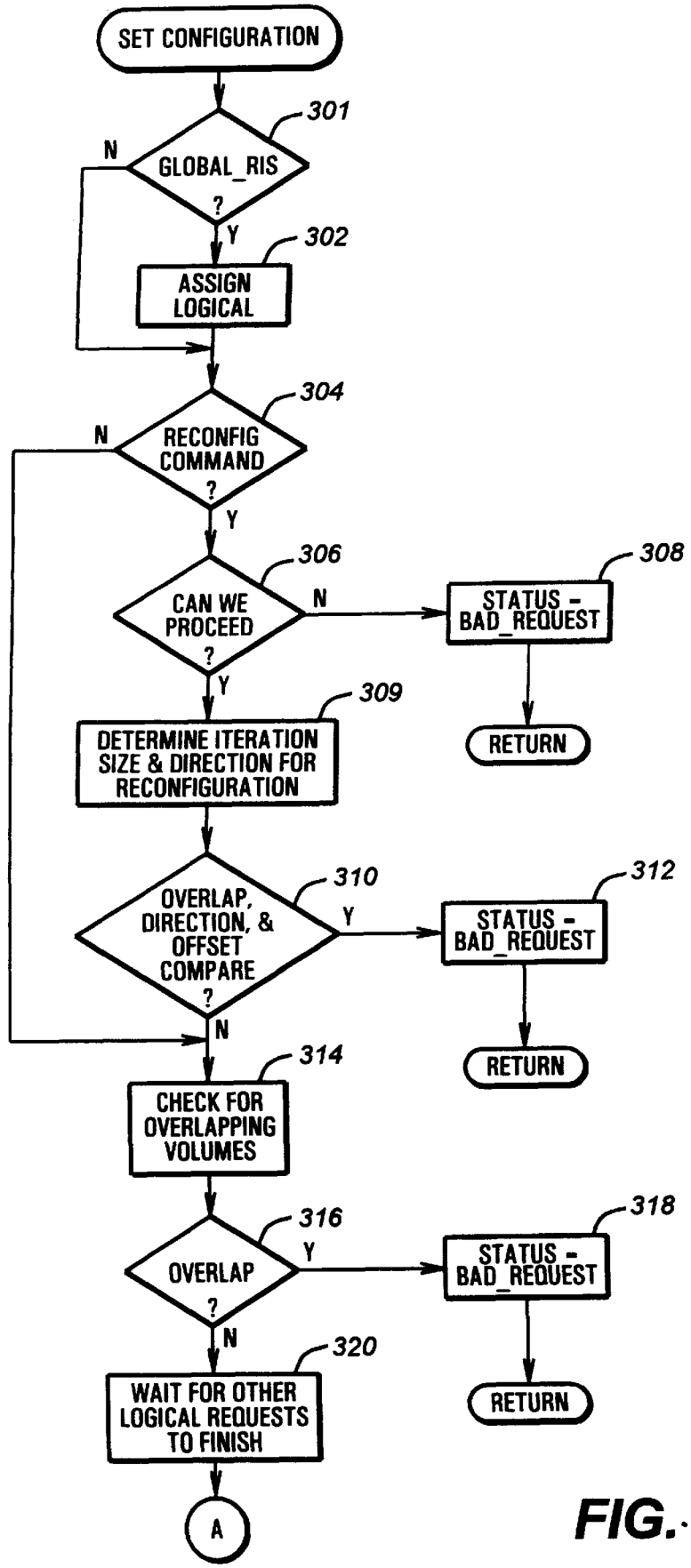
FIGS. 3A–3C are a flow diagram of a set configuration routine which requests the reconfiguration operation according to the present invention.
Figure 3B:
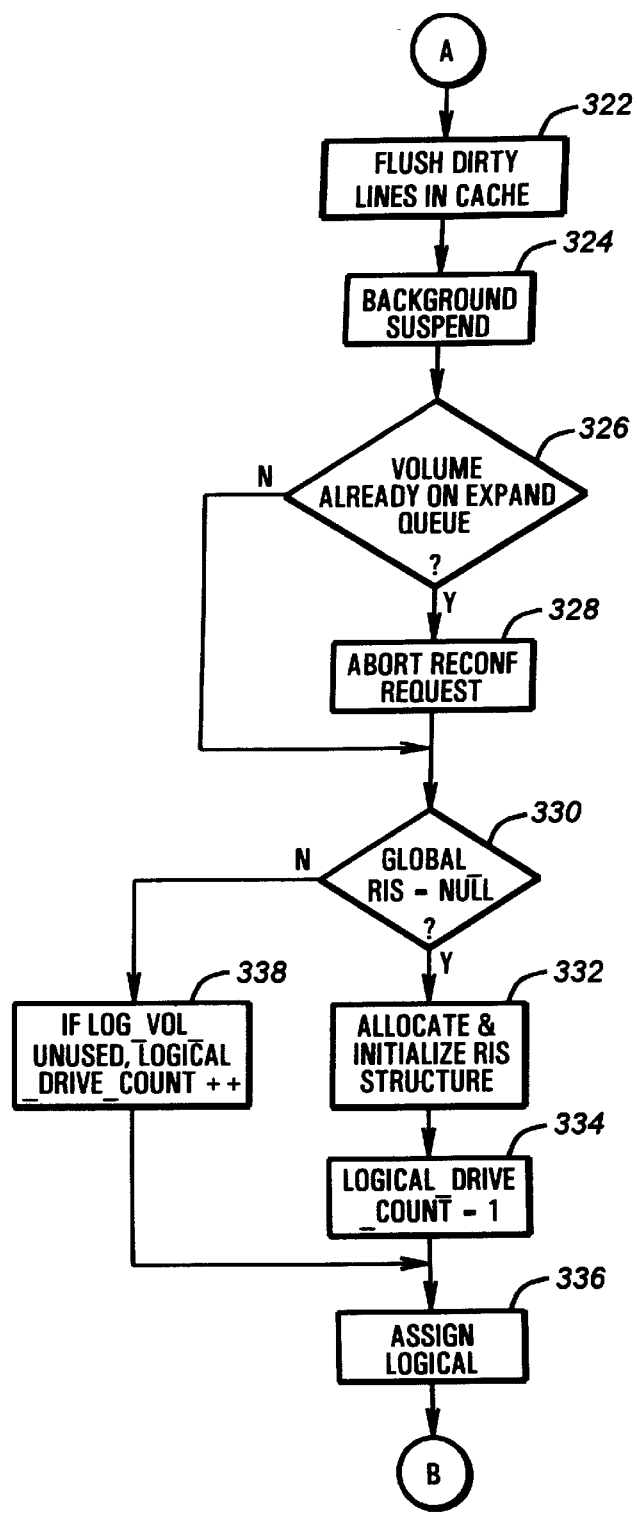
Figure 3C:
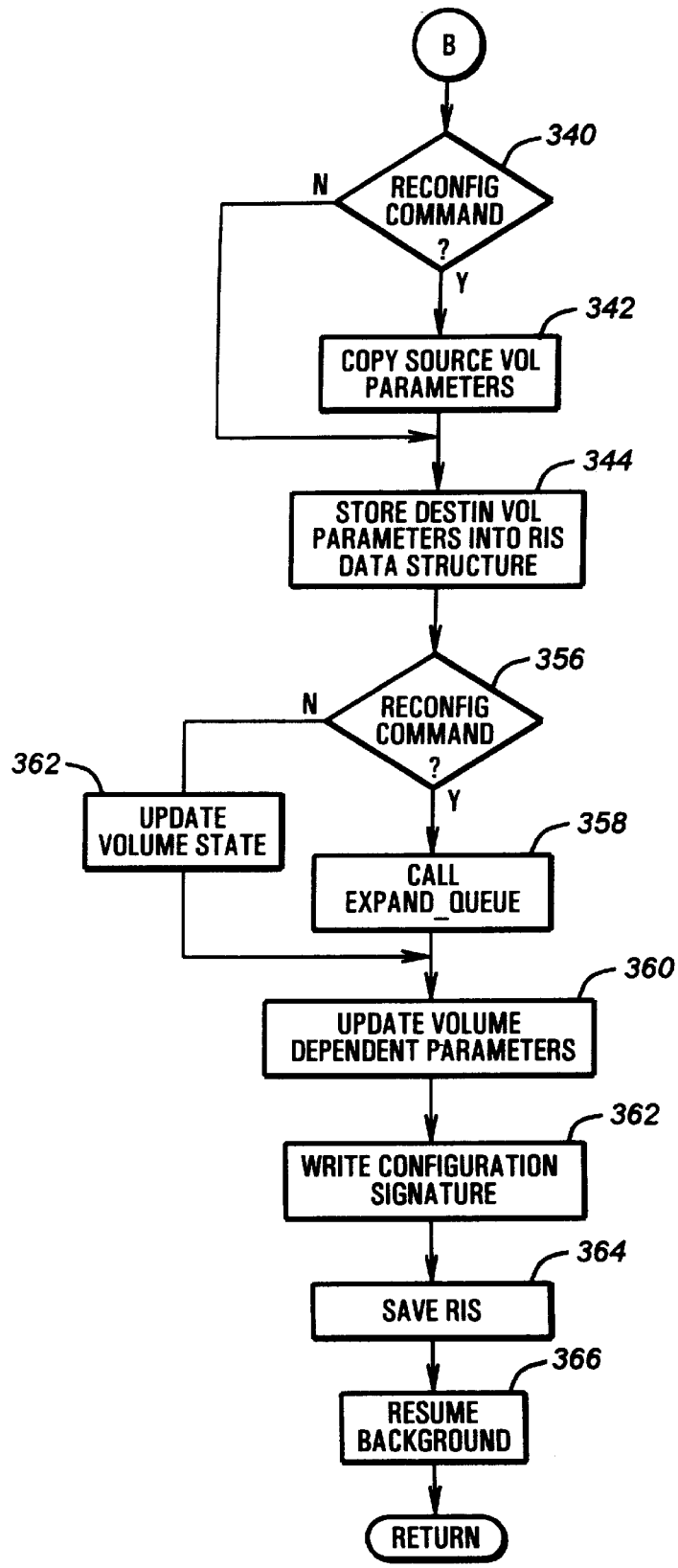

Referring now to FIGS. 3A–3C, a flow diagram of the SET_CONFIGURATION task is shown. Proceeding first to step 301, it is determined if a parameter GLOBAL_RIS has a non-NULL value. The parameter GLOBAL_RIS is a pointer to a location in memory storing the global RIS structure. Each logical volume is associated with specific configuration parameters, and each of the controllers 112A–E are associated with certain controller parameters. The configuration and controller parameters are stored in reserved information sectors (RIS) in each logical volume. The global RIS data structure is allocated in the local memory 108 to store the RIS information of the logical volumes in the disk subsystem 142 for faster access of the configuration and controller information. The RIS data structure also stores parameters associated with the reconfigure operation. If the GLOBAL_RIS parameter has a NULL value, that indicates that the controller board 10 has just started up and that no logical volume has been configured yet. If the parameter GLOBAL_RIS has a NULL value, control proceeds to step 304; otherwise, if the parameter GLOBAL_RIS has a non-NULL value, control proceeds to step 302, where a parameter LOGICAL is set to point to the starting location of the area in the RIS data structure which contains the configuration and controller parameters of the specified logical volume, which for purposes of the reconfigure process is the destination logical volume. Control proceeds from step 302 to step 304.

In step 304, it is determined if the specified request command is a disk array reconfigure command. If a disk array reconfigure request is specified, control proceeds to step 306; otherwise, control proceeds to step 314. In step 306, it is determined if any of the conditions listed below is true: the parameter LOGICAL_UNIT_PHYSICAL_DRIVE_COUNT is set to zero, indicating a command to delete the specified logical volume; the parameter GLOBAL_RIS contains a NULL value, i.e., the specified logical volume does not exist; the state of the logical volume is LOG_VOL_UNUSED, indicating that the logical volume is currently unused; the cache board containing the DRAM interface 118 and the DRAM 116 is not present; the batteries 144 for backing up portions of the DRAM 116 are not charged; or a reconfigure request is currently pending for the specified logical volume. If any of the above conditions is true, then the disk array reconfigure request cannot proceed. Control then proceeds to step 308, where the STATUS field of the current request is set to the state BAD_REQUEST to indicate that the reconfigure request is unable to proceed. From step 308, control returns to the calling task.

If none of the conditions tested for in step 306 are true, then control proceeds to step 309, where the direction of the reconfigure operation and the iteration size are set. The direction of the reconfigure process is set in the forward direction, i.e., start at first stripe and proceed to last stripe, or in the reverse direction, i.e., start in the last stripe and stop in the first stripe. The direction is indicated by a parameter DIRECTION_UP, which when set true indicates that the reconfigure process proceeds in the forward direction. The value of the parameter DIRECTION_UP is set true if the number of drives in the destination logical volume is greater than or equal to the number of drives in the source logical volume.

The iteration size, represented by a parameter ITERATION_BLOCK_COUNT, is set by comparing the values of the parameter DISTRIBUTION_FACTOR in the destination logical volume and the parameter DISTRIBUTION_FACTOR in the source logical volume. The parameter DISTRIBUTION_FACTOR represents the number of sectors in a striping unit. If the parameters in the source and destination logical volumes are equal, then the iteration size ITERATION_BLOCK_COUNT is set to the stripe size of the destination logical volume. Otherwise, if the parameters are not equal, then the iteration size is equal to the least common denominator of the source volume stripe size and destination volume stripe size. For example, if the source volume stripe size is 12 sectors and the destination volume stripe size is 18 sectors, the iteration size is set to 36 sectors. If the iteration size ITERATION_BLOCK_COUNT is greater than 8,000, which represents the size of the cache RAM 116 in sectors, control returns to the calling program with the flag STATUS set to state BAD_REQUEST. The iteration size is the transfer size for each reconfigure step to prevent overlap when the distribution factors are different for the source and destination logical volumes.

Next, control proceeds to step 310, where it is determined if the source volume and the destination volume in the reconfiguration operation overlap. It is also determined if the parameter DIRECTION_UP is set true and if the parameter OFFSET_TO_DATA of the destination volume is greater than parameter OFFSET_TO_DATA of the source volume. If so, then the STATUS field of the request is set to the state BAD_REQUEST in step 312. Alternatively, if it is determined that the destination volume overlaps the source volume, the parameter DIRECTION_UP is set false, and the parameter OFFSET_TO_DATA of the destination volume is less than the parameter OFFSET_TO_DATA of the source volume, the STATUS field of the current request is also set to the state BAD_REQUEST in step 312. Either of the above two conditions would cause portions of the source logical volume to be overwritten before data in those portions have been transferred to the destination logical volume. From step 312, control returns to the calling task.

If neither of the conditions tested for in step 310 is true, then control proceeds from step 310 to step 314. In step 314, a check is performed to determine if the destination volume would overlap any other logical volume. The space in the disk array used for the destination volume must not already be used by another logical volume, or be allocated as a spare drive space for another logical volume. All space used in the destination volume must either be space used by the source volume, spare drive space for the source volume, or unused drive space. In step 316, it is determined if an overlap occurs. If so, control proceeds to step 318, where the STATUS field of the request is set to the state BAD_REQUEST. From step 318, control returns to the calling task.

If no overlap is detected in step 316, control proceeds to step 320, where the SET_CONFIGURATION task pauses while other outstanding host logical requests, if any, are being processed. When all other logical requests are completed, control proceeds to step 322. In step 322, it is determined if the dirty lines in the write posting cache 136 have been flushed to the disk subsystem 142. If not, the SET_CONFIGURATION task is again paused while the dirty lines in the cache 136 are being flushed. Next, in step 324, any background task that is running is suspended. This is necessary to pause rebuild, surface analysis and other background tasks while reconfiguring.

From step 324, control proceeds to step 326, where it is determined if the volume is already on the expand queue. If so, control proceeds to step 328, where the reconfigure request that is pending in the queue is aborted by calling an EXPAND_ABORT task. This allows a SET CONFIGURATION command to be issued to abort a CHANGE CONFIGURATION reconfiguration command. When a reconfigure request is aborted, a parameter EXPAND_UNIT_COUNT is decremented to indicate one less pending reconfigure request. In addition, an interrupt is generated back to the host by the local processor 106 to indicate that the reconfigure request has been aborted. From step 328, control proceeds to step 330. Control also proceeds from step 326 to 330 if it is detected that the specified volume is not in the expand queue.

In step 330, it is determined if the parameter GLOBAL_RIS has a NULL value. If the parameter GLOBAL_RIS contains a NULL value, then that indicates this is the first occurrence of the SET CONFIGURATION command to configure the first logical volume. If the parameter GLOBAL_RIS contains a NULL value, control proceeds to step 332, where the global RIS data structure is allocated in the local memory 108. In addition, the contents of the global RIS structure are initialized. Next, in step 334, a parameter LOGICAL_DRIVE_COUNT is set to the value 1 to indicate that one volume has been configured. From step 334, control proceeds to step 336.

If the global RIS data structure already exists, as indicated by the parameter GLOBAL_RIS containing a non-NULL value in step 330, control proceeds to step 338, where it is determined if the volume state of the specified logical unit is in the unused or LOG_VOL_UNUSED state. If that is true, then the logical drive count parameter LOGICAL_DRIVE_COUNT is incremented by the value 1 to indicate the availability of another logical volume. From step 338, control proceeds to step 336.

In step 336, the parameter LOGICAL is set to an offset value representing the starting location of an area in the global RIS data structure storing the configuration and controller parameters of the specified volume unit. Note that this was already done in step 302 if the parameter GLOBAL_RIS was a non-NULL value. In step 336, there exists the possibility that a new RIS data structure was allocated in step 332, thereby necessitating that the LOGICAL parameter be defined afterwards.

Proceeding next to step 340, it is determined if the submitted request command is a disk array reconfigure command. If so, control proceeds to step 342, where the parameters of the source logical volume are copied to another portion of the global RIS data structure. The source configuration parameters are stored in a separate area of the RIS data structure for later access.

From step 342, or from step 340 if it is determined that the submitted request command is not a reconfigure command, control also proceeds to step 344. In step 344, the destination volume configuration parameters specified by the host SET CONFIGURATION or CHANGE CONFIGURATION command are stored into the global RIS data structure beginning at a location corresponding to the destination logical volume, i.e., the former location of the source logical volume.

Proceeding next to step 356, it is again determined if the submitted request command is a reconfiguration command. If so, control proceeds to step 358, where an EXPAND_QUEUE task is invoked to queue the reconfigure request in the expand request queue EXPAND_UNIT_QUEUE[I]. The EXPAND_QUEUE task is described with FIG. 5 below. From step 358, control proceeds to step 360.

If in step 356 it is determined that the submitted request is not a reconfigure request, then control proceeds to step 360, where the volume state of the specified logical volume is updated by invoking a task UPDATE_LOGICAL_UNIT_STATE. The routine modifies the volume state of the specified logical drive based upon the states of all of the physical drives in the volume and the fault tolerance mode of the volume. Thus, for example, if no fault tolerance is selected, any failed physical drive would cause the volume state to be set to the failed state. However, if RAID 1, 4, or 5 fault tolerance mode is selected, then data on a failed disk drive may be recoverable depending on whether replacement and spare drives are currently used. The UPDATE_LOGICAL_UNIT_STATE routine also sends out an interrupt to the host computer system 100 when the volume state has been updated. In step 362, this indicates to the host operating system that a new logical volume has been configured. From step 362, control proceeds to step 360.

In step 360, parameters associated with the cache which are dependent upon the specified logical volume are initialized. These cache parameters include a bit map indicating if posted writes are enabled for a logical volume. These cache parameters are also stored in the global RIS data structure. Next, proceeding to step 362, the configuration signature associated with the destination logical volume is saved in a reserved configuration area in the write posting cache 136. This signature is used during the power recovery operation to determine if an interrupted reconfigure operation is to be resumed. Proceeding next to step 364, the parameters that are stored in the global RIS data structure in the local memory 108 are written back to the reserved information sectors of the specified logical volume. From state 364, control proceeds to step 366, where background tasks suspended in step 324 are resumed. From step 366, control returns to the calling program.

Figure 4:
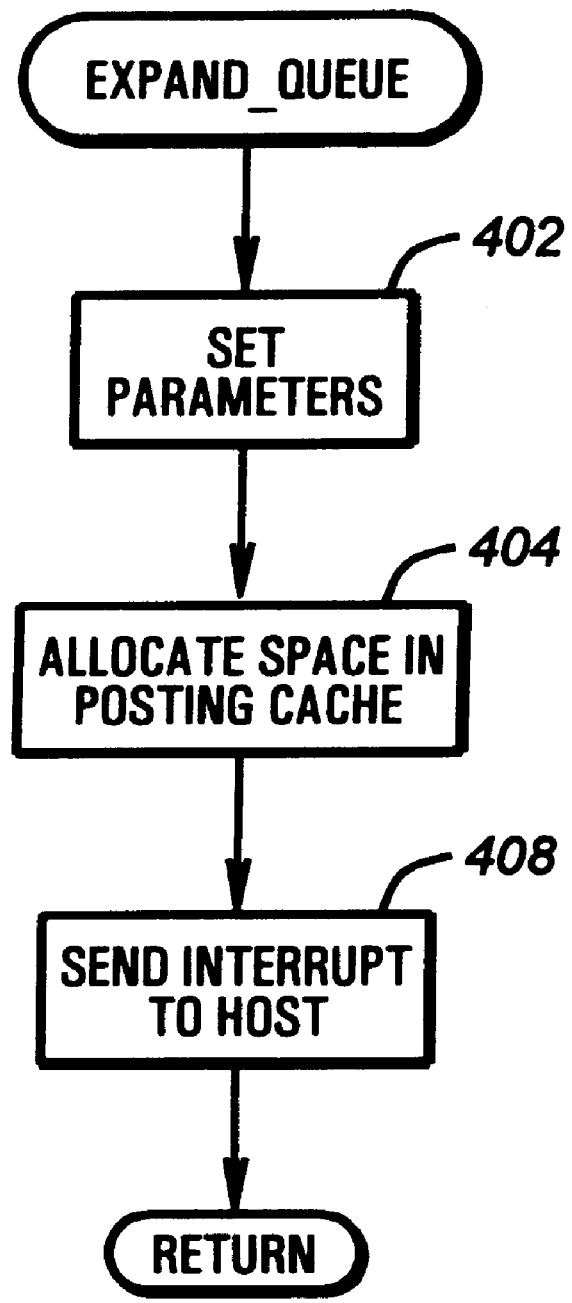
FIG. 4 is a flow diagram of a routine for queuing disk array reconfigure requests.

Referring now to FIG. 4, a flow diagram is shown of the EXPAND_QUEUE task. As noted earlier, the EXPAND_QUEUE task enters a reconfigure request into the expand request queue EXPAND_UNIT_QUEUE[I]. Beginning in step 402, the EXPAND_UNIT_COUNT parameter, which represents the number of reconfigure requests outstanding, is incremented by the value 1. The incremented value of the parameter EXPAND_UNIT_COUNT is used to point to the current index into the queue EXPAND_UNIT_QUEUE. The volume unit number UNIT of the reconfigure request is written into the queue. In addition, in step 402, the parameter EXPAND_NEEDED is set to the TRUE state.

Proceeding next to step 404, a portion of the DRAM 116 is allocated for the reconfigure task. The allocated portion is equal to the maximum iteration block count of all the reconfigure requests in the queue. The allocated portion of the DRAM 116 is battery-backed. Next, control proceeds to step 408, where an interrupt is asserted to the host computer to indicate that the disk array reconfigure request has been queued successfully. From step 408, control returns to the calling program.

Figure 5:
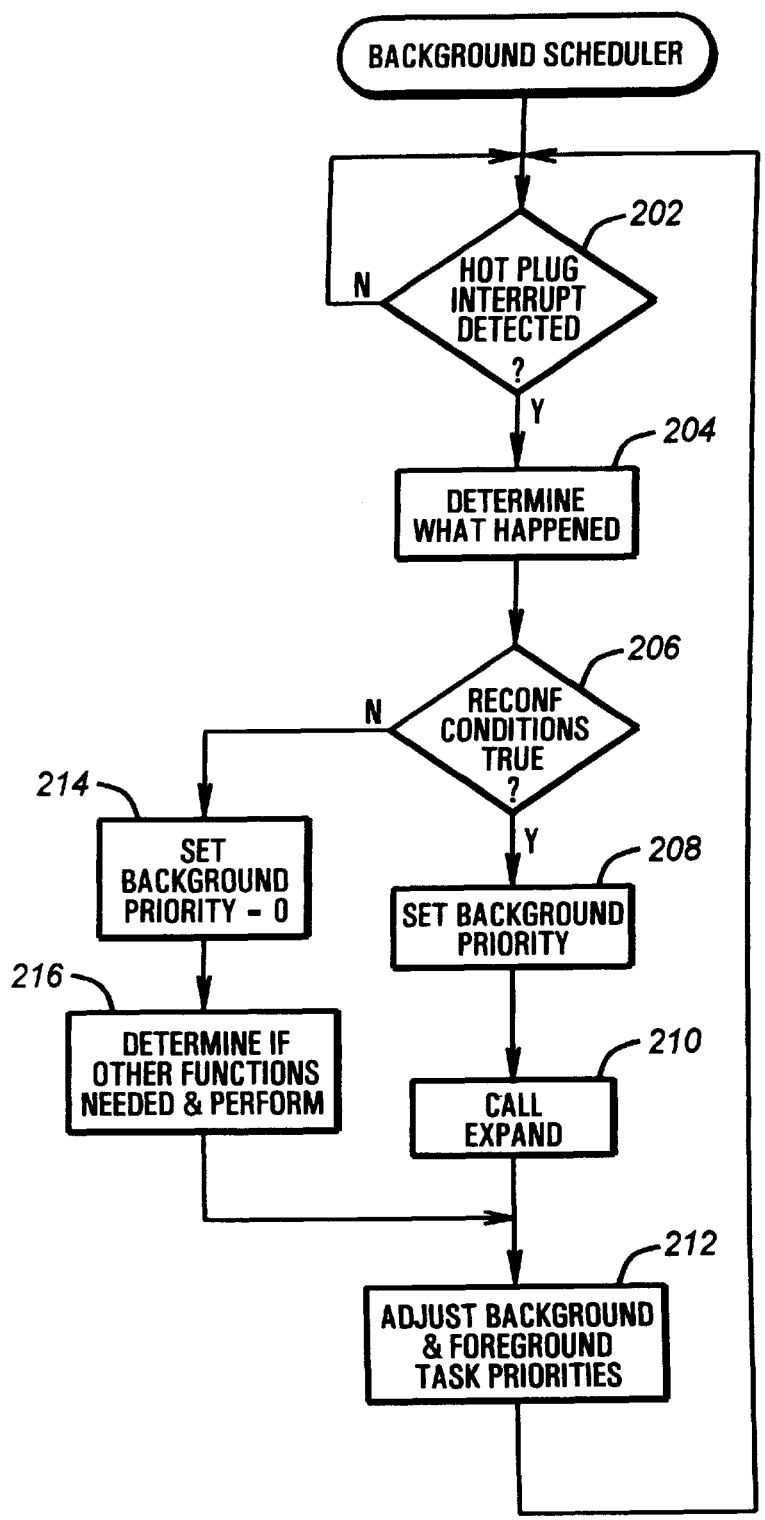
FIG. 5 is a flow diagram of a background scheduler task which determines if a reconfigure task is needed.
Figure 6A:
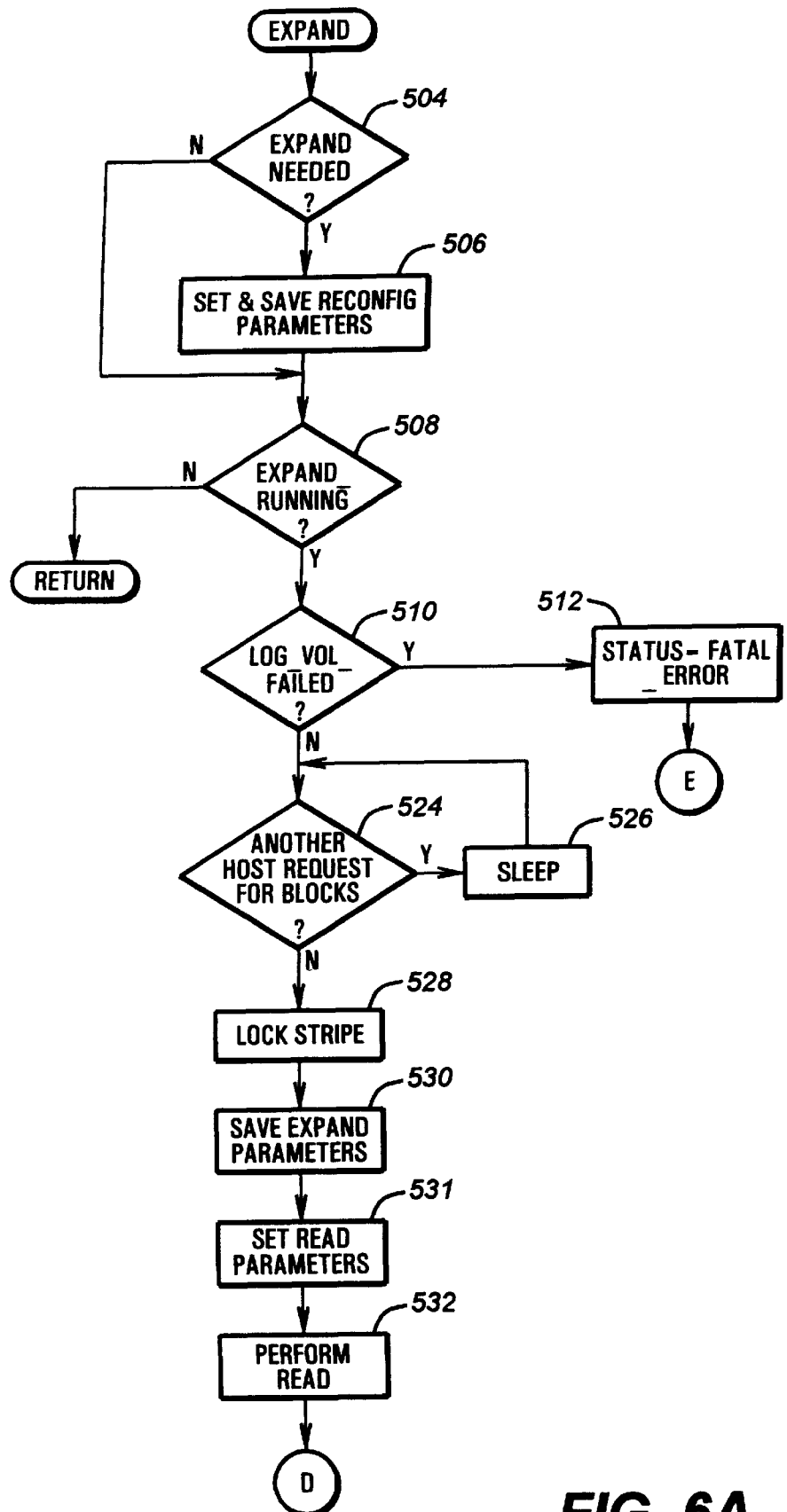
FIGS. 6A–6D are a flow diagram of the reconfigure task according to the present invention.
Figure 6B:
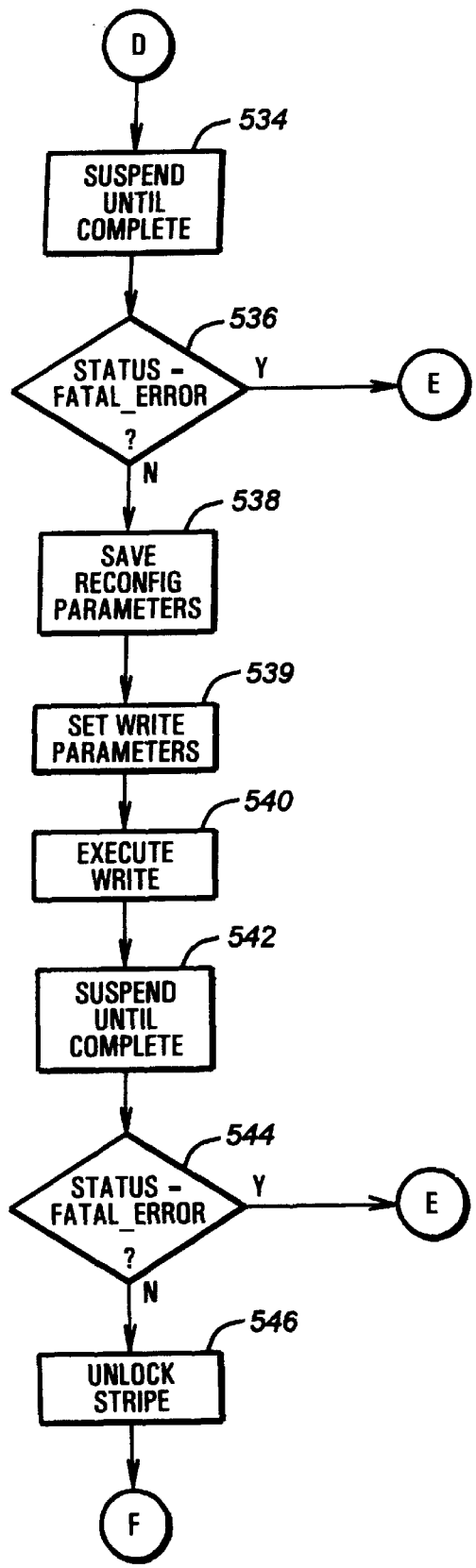
Figure 6C:
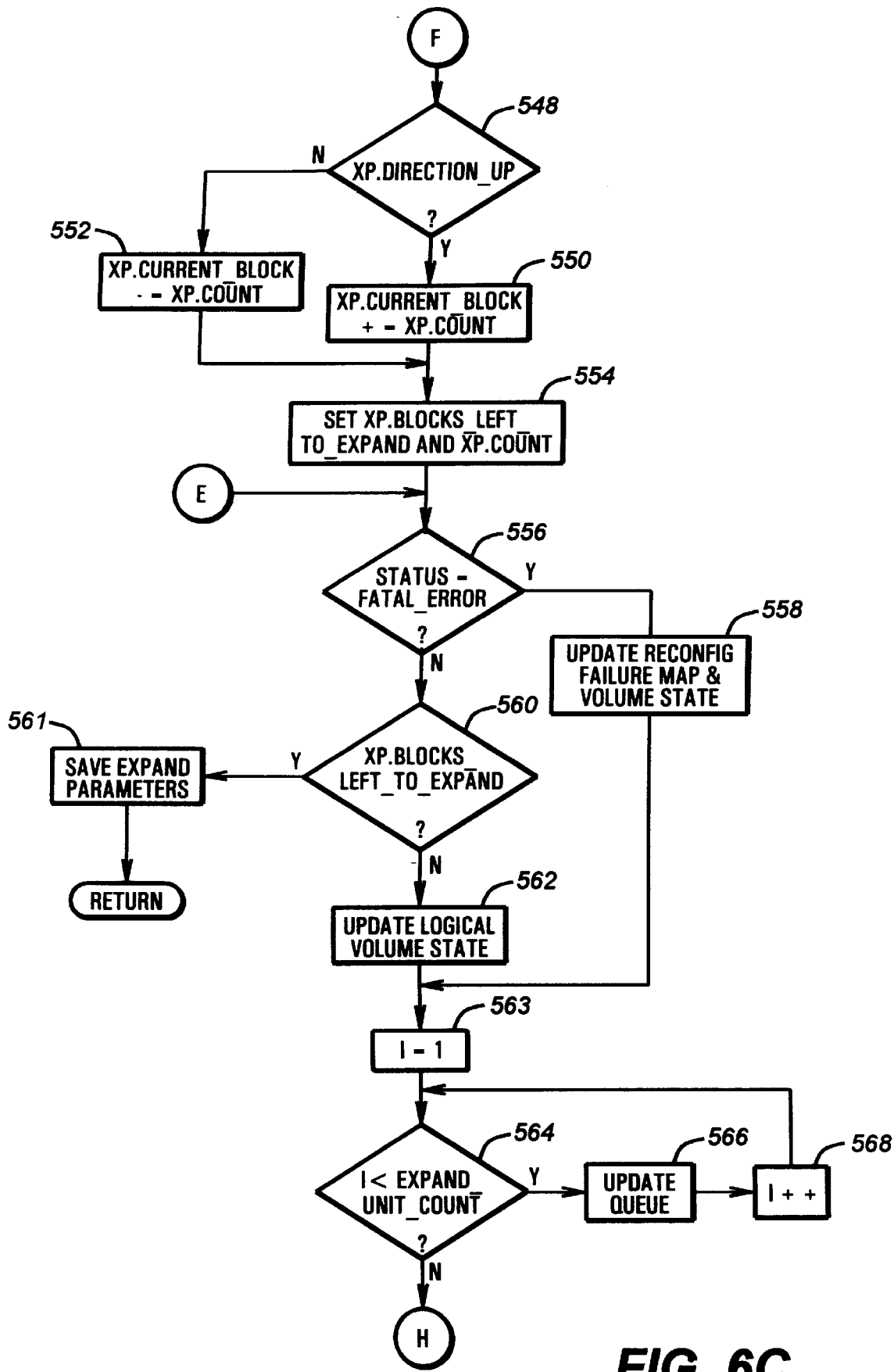
Figure 6D:
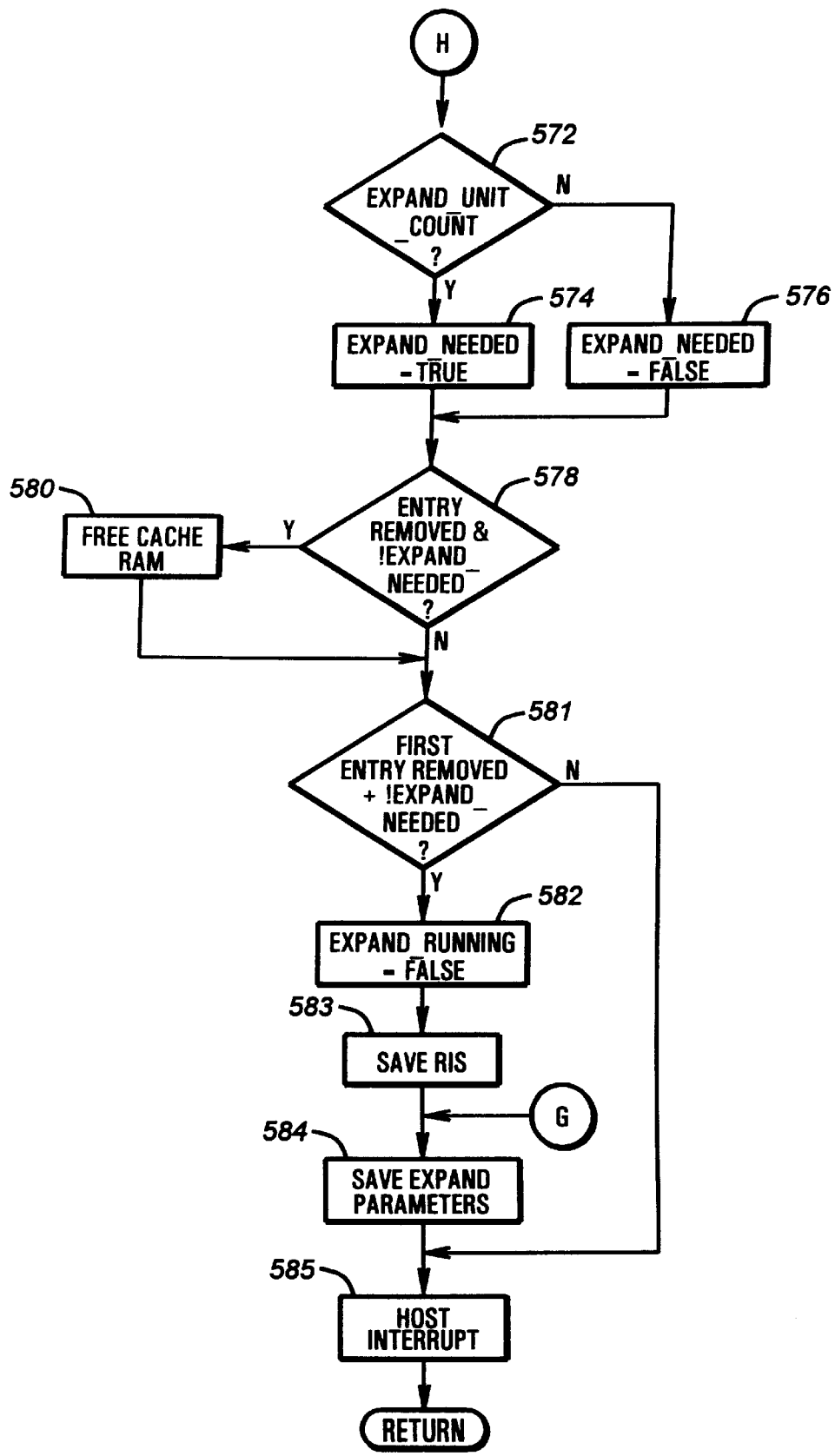

Referring now to FIG. 5, a flow diagram is shown of portions of a background scheduler task. The background task determines if any one of the following background disk operations are needed: a disk array reconfigure operation, a rebuild operation, a monitor and performance operation, or a disk surface analysis operation. The disk array reconfigure operation is performed to allocate a different number of disk drives to a logical volume. The rebuild process is performed to recover data when a failed drive is detected and a spare is used to replace it or if a previously failed drive has been replaced (hot plugged). The monitor and performance task determines if the physical drives have violated certain performance thresholds, such as the maximum allowed number of read or write errors, the maximum acceptable number of seek errors, the maximum acceptable value for the spin up time, and many other performance parameters. The monitor and performance threshold data can be set to a desired value by a user by submitting the appropriate command from the host computer. The disk surface analysis task checks for media defects and performs consistency checks of the hard disk drives.

In step 202, it is determined if a hot plug interrupt has been detected. As noted above, a hot plug interrupt is asserted by one of the microcontrollers 140A–E associated with the five sets of physical drives 114A–E. A hot plug interrupt is generated if a physical disk drive is inserted or removed. In the preferred embodiment, each microcontroller 140A–E asserts the hot plug interrupt through a reserved pin of the corresponding 53C825 SCSI controller 112A–E. Firmware running on each SCSI controller 112A–E then sets the appropriate one of the interrupt bits HOT_PLUG_BUS [I], I=0–5, which correspond to the five SCSI controllers 112A–E.

If any bit of the variable HOT_PLUG BUS[I] is set, control proceeds to step 204. In step 204, a routine HOT_PLUG is invoked by the background task to determine what caused the hot plug interrupt. The HOT_PLUG routine builds a list of commands in the local memory 108 to perform the inquire cycle. Next, the HOT_PLUG routine submits a command block to the appropriate one of the SCSI controllers 112A–E. The command block indicates the starting address in the local memory 108 of the command list. In response, the selected SCSI controller 112 obtains control of the PCI bus 102 to fetch commands from the local memory 108. The command list causes the SCSI controller 112 to perform a read command across the SCSI bus to the microcontroller 140 to determine the type of event that caused the hot plug event. Such events include a physical drive being installed, a physical drive being removed, or a physical drive being removed and re-inserted. The microcontroller stores various status bits indicating which drives are connected and if a change has occurred in the connections. Command cycles between the SCSI controllers 112A–E and microcontrollers 140A–E are performed using SCSI command cycles.

Proceeding next to step 206, a check is performed to determine the states of the parameter EXPAND_NEEDED, which when set high indicates a disk array reconfigure request is pending, or a parameter EXPAND_RUNNING, which when set high indicates that a reconfigure process is currently in progress. If either of the parameters is set high and a parameter REBUILD_RUNNING is low, indicating that a rebuild process is currently not in progress, control proceeds to step 208.

In step 208, the priority of the background task, which in this instance is the reconfigure task, is set. A parameter BACKGROUND_PRIORITY is set equal to the value stored at location EXPAND_PRIORITY in the global RIS data structure. The priority of the reconfigure task is user-selectable. For a more detailed description of how the background priority affects operation of foreground tasks, refer to Ser. No. 08/542,800 entitled "User Selectable Priority for Disk Array Background Operations," filed concurrently herewith, which is hereby incorporated by reference.

Next, control proceeds to step 210, where the EXPAND task is invoked to perform the reconfigure operation. From step 210, control proceeds to step 212. In step 206, if neither of the parameters EXPAND_NEEDED or EXPAND_RUNNING is set high, or if the parameter REBUILD_RUNNING is set high, control proceeds to step 214, where the background priority parameter BACKGROUND_PRIORITY is set to zero to indicate that the background task has the lowest priority. Next, control proceeds to step 216, where it is determined if certain background functions are to be performed. In the preferred embodiment, these certain other functions include the monitor and performance task and the disk surface analysis task.

From step 216, control proceeds to step 212. In step 212, the pause duration and pause interval time for the foreground tasks is set according to the value of the parameter BACKGROUND_PRIORITY. Depending on the priority set for the background task, delays are added to the foreground task. For example, if the parameter BACKGROUND_PRIORITY is set to zero, then no delay is added to any request from the host computer. If the parameter BACKGROUND_PRIORITY is set to 127, then a 0.1 second delay is added to every host request. If the parameter BACKGROUND_PRIORITY is set to 255, then a 1.6 second delay is added to every host request. For more details of the priority adjustment scheme, refer to the Patent Application entitled "User Selectable Priority for Disk Array Background Operations," referenced above. From step 212, control returns to step 202. Thus, the background scheduler task is continuously run by the local processor 106.

Referring now to FIGS. 6A–6D, a flow diagram is shown of the EXPAND task. The EXPAND task is repetitively called by the background scheduler task until the reconfigure operation is completed. Proceeding first to step 504, it is determined if the parameter EXPAND_RUNNING is low and the parameter EXPAND_NEEDED is high. If both the above conditions are true, control proceeds to step 506, where various reconfigure parameters are set. These reconfigure parameters are stored in the XP data structure. The parameters include the logical volume unit number LOGICAL_UNIT, which is set equal to the volume unit number stored in the expand request queue location EXPAND_UNIT_QUEUE[0]. The pointer to the source logical volume configuration information is also retrieved and placed into a parameter X_OLD_LOGICAL. The full stripe size of the destination logical volume is placed into a parameter FULL_STRIPE_SIZE, and is calculated by multiplying the parameter DISTRIBUTION_FACTOR by the number of physical data drives. A parameter BLOCKS_LEFT_TO_EXPAND is set equal to the value of the parameter BLOCKS_ON_VOLUME of the source logical volume. Thus, the parameter BLOCKS_LEFT_TO_EXPAND is initially set equal to the total number of usable sectors in the source volume. In step 506, a check is also performed to determine if the number of sectors in the source volume is greater than the number of sectors in the destination volume. If so, the parameter BLOCKS_LEFT_TO_EXPAND is set equal to the parameter BLOCKS_ON_VOLUME of the destination volume. In this case any remaining blocks in the source volume will simply be lost. If desired, the host software can be programmed to prevent reconfiguration if the number of sectors in the source logical volume is greater than the number of sectors in the destination logical volume.

A parameter TOTAL_BLOCKS is set equal to the initial value of the parameter BLOCKS_LEFT TO_EXPAND. If the parameter TOTAL_BLOCKS is less than or equal to the parameter ITERATION_BLOCK_COUNT, then the reconfigure operation can be performed in one iteration. In this case, the parameter DIRECTION_UP is set true, a parameter STARTING_BLOCK is set to the value zero, and a parameter COUNT is set to the value of TOTAL_BLOCKS. The parameter COUNT specifies the number of blocks involved in the current reconfiguration move operation, and the parameter STARTING_BLOCKS specifies the starting position of the reconfiguration operation. If the above condition is not true, then the following comparisons are performed. If the parameter DIRECTION_UP is set true, then the parameter STARTING_BLOCK is set to the value zero, and the parameter COUNT is set to the value of the parameter ITERATION_BLOCK_COUNT. Otherwise, if the parameter DIRECTION_UP is set false, the value of COUNT is set equal to the MOD of the parameters TOTAL_BLOCKS and FULL_STRIPE_SIZE, which obtains the number of sectors in the last stripe. When the reconfigure operation proceeds in the reverse direction, there is a possibility that the size of the first stripe accessed is not the full stripe size. In that instance, the value of the parameter COUNT must be adjusted to accommodate the different size. In step 506, if it is determined that the parameter DIRECTION_UP is set low, the actual number of sectors to be worked upon by the EXPAND task is placed into the parameter COUNT by performing the above MOD operation. If the result is zero, indicating that the last stripe is a full stripe, then the value of COUNT is set equal the parameter ITERATION_BLOCK_COUNT. The parameter STARTING_BLOCK is set to the value {TOTAL_BLOCKS-COUNT}, which is the address of the first sector in the last stripe of the destination volume.

Finally, a parameter CURRENT_BLOCK that keeps track of the sector currently accessed by the EXPAND task is initially set equal to the value of the parameter STARTING_BLOCK. A parameter CURRENT_ENDING_BLOCK representing the last current block is set equal to the value {CURRENT_BLOCK+COUNT-1}. The parameter EXPAND_RUNNING is set to the TRUE state to indicate that the EXPAND task is in progress.

The reconfiguration parameters described above are stored in the XP (expand progress) data structure located in the local memory 108. Hereinafter, the symbol "XP." will be used to point to a parameter in the XP structure. After the parameters are set in the local memory 108, the XP data structure is copied to the configuration area in the write posting cache 136 to update the progress of the EXPAND task. The current values of the RIS parameters are also written back to the reserved information sectors of the destination logical volume.

From step 506, control proceeds to step 508. Also, if any of the conditions checked for in step 504 is not true, then control proceeds from step 504 to step 508. In step 508, a check is performed to determine if the parameter EXPAND_RUNNING is set high. If true, then control proceeds to step 510, where it is determined if the state of the destination logical volume is LOG_VOL_FAILED. If so, control proceeds to step 512, where the STATUS flag of the request is set to state FATAL_ERROR. From step 512, control proceeds to step 556. If, in step 510 the destination logical volume is not at state LOG_VOL_FAILED, control proceeds to step 524. From step 508, if the parameter EXPAND_RUNNING is not true, then control returns to calling program.

While the EXPAND task is working on a particular stripe, the sectors in that stripe must be locked so that no other host request can access the same sectors. A table is kept in the local RAM 108 which keeps track of all the sectors currently accessed. In step 524, it is determined if any of the sectors in the current stripe are the subject of a current host request. If so, those sectors cannot be locked by the EXPAND task. As a result, control proceeds to step 526, where the EXPAND task is temporarily paused, preferably for approximately 0.1 seconds, to allow the host request to complete execution. Control returns to step 524 to determine if the accessed sectors are still busy. If not, control proceeds to step 528, where the stripe in the destination volume currently accessed by the EXPAND task is locked. When the desired stripe is properly locked, control proceeds to step 530.

In step 530, the current values of the reconfiguration parameters in the XP data structure are saved to the configuration area of the write posting cache 136. The next steps to be performed by the EXPAND task are the read and write steps, in which data from the source volume are transferred to the write posting cache 136, which are then written back to the destination logical volume. Several parameters are passed along with the read and write requests. Proceeding next to step 531, parameters associated with the read and write requests are set. The reconfigure logical request information is stored in an area of local memory 108 starting at location EXPAND_LOGICAL. A parameter EXPAND_LOGICAL.UNIT is set equal to the value of XP.LOGICAL_UNIT. A status parameter EXPAND_LOGICAL.STATUS is set to state NO_ERROR. Parameters EXPAND_LOGICAL.BLOCK and EXPAND_LOGICAL.BLOCK_COUNT are set equal to the values of parameters XP.CURRENT_BLOCK and XP.COUNT, respectively. A parameter EXPAND_LOGICAL.REQUEST_TYPE is set equal to a state equal to the bit-wise OR of states EXPAND_REQUEST, INTERNAL_LOGICAL_REQ, and LOCKED_BY_ORIGINATOR. Thus, the REQUEST_TYPE parameter indicates that the current request is a disk array reconfigure request, a request that is performed entirely within the disk controller board 10, and a request that is locked by the requestor. Additionally, a parameter EXPAND_LOGICAL.COMMAND is set to state READ to indicate a read command is to be performed.

Proceeding next to step 532, a routine EXECUTE_LOGICAL_REQUEST is invoked, passing along the information pointed to by EXPAND_LOGICAL. The read logical request moves data from the source volume into the transfer portion of the write-posting cache 136. The amount of data moved is preferably equal to one stripe of the destination volume. Next, in step 534, the operation of the EXPAND task is suspended until the read operation in step 532 has completed. Once the routine EXECUTE_LOGICAL_REQUEST indicates that the read operation has completed, control proceeds to step 536, where the STATUS flag returned by the routine EXECUTE_LOGICAL_REQUEST is checked. If it is determined that a fatal error has occurred, control proceeds to step 556 to handle the fatal error condition. If no fatal error is indicated, control proceeds to step 538, where the current values of the reconfigure parameters in the XP data structure are again saved to the configuration area in the write posting cache 136 to update the progress information of the EXPAND task.

From step 538, control proceeds to step 539, where parameters for the next logical request are set. The parameters are set to the same values as the read logical request, except that the parameter EXPAND_LOGICAL.COMMAND is set to state WRITE_TO_MEDIA. Next, in step 540, the routine EXECUTE_LOGICAL_REQUEST is invoked to perform a write-to-media operation. This command causes data from the source logical volume just transferred to the write posting cache 136 to be written back to the corresponding stripe in the destination logical volume. Next, control proceeds to step 542, where the operation of the EXPAND task is suspended until the routine EXECUTE_LOGICAL_REQUEST indicates that it has completed. Proceeding next to step 544, the STATUS flag of the write operation is checked. If a fatal error is detected, then control proceeds to step 556. Otherwise, control proceeds to step 546, where the stripe locked in step 528 is unlocked to allow access by other logical requests.

Next, in step 548, it is determined if the parameter XP.DIRECTION_UP is set high. If so, control proceeds to step 550, where the parameter XP.CURRENT_BLOCK, which tracks the current sector accessed by the EXPAND task, is incremented by the value XP.COUNT. If the parameter XP.DIRECTION_UP is set low in step 548, then control proceeds to step 552, where the parameter XP.CURRENT_BLOCK is decremented by the value XP.COUNT. From either step 550 or 552, control proceeds to step 554, where the parameter XP.BLOCKS_LEFT_TO_EXPAND is decremented by the value XP.COUNT. In step 554, the parameter XP.COUNT is then set to the value of the parameter ITERATION_BLOCK_COUNT, unless the value of ITERATION_BLOCK_COUNT is greater than the value of the parameter BLOCKS_LEFT_TO_EXPAND, in which case the value of COUNT is set equal to BLOCKS_LEFT_TO_EXPAND. The value of the parameter CURRENT_ENDING_BLOCK is then set to the value {CURRENT_BLOCK+COUNT-1}.

From step 554, control proceeds to step 556, where the STATUS flag is checked to determine if it is at state FATAL_ERROR. If so, control proceeds to step 558; if not, control proceeds to step 560. In step 558, an expand failure map is updated with the destination volume state being marked as state LOG_VOL_FAILED. From state 558, control proceeds to state 564.

In step 560, it is determined if the parameter XP.BLOCKS_LEFT_TO_EXPAND is non-zero, which indicates that the reconfigure process should continue. If the parameter XP.BLOCKS_LEFT_TO_EXPAND is equal to zero, control proceeds to step 562; otherwise, control proceeds to step 561, where the reconfigure progress information is written to the configuration area of the write posting cache 136. From step 561, control returns to the calling program.

In step 562, the routine UPDATE_LOGICAL_UNIT_STATE is invoked to modify the volume state of the destination logical volume. As noted earlier, the routine UPDATE_LOGICAL_UNIT_STATE updates the volume state based upon the states of the physical drives and the fault tolerance mode. In addition, the UPDATE_LOGICAL_UNIT_STATE task invokes an interrupt to the host operating system to indicate the completion of the reconfigure process in step 562.

From step 562 or step 558, control proceeds to step 563, where an increment variable I is set to the value 1. Next, in step 564, it is determined if the value of the parameter I is less than the parameter EXPAND_UNIT_COUNT. If so, control proceeds to step 566, where the expand request queue is updated if the requested logical volume matches a logical volume in the queue. If the requested logical volume is in the queue, then the entries of the expand request queue EXPAND_UNIT_QUEUE are shifted down, i.e., the entry in EXPAND_UNIT_QUEUE[I] is shifted into the entry at EXPAND_UNIT_QUEUE[I-1]. For each match, the parameter EXPAND_UNIT_COUNT is also decremented by the value 1. This operation has one of two effects. If a SET CONFIGURATION command is submitted that is not a reconfigure command, then the requested logical volume is removed from the expand request queue. This allows the SET CONFIGURATION command to abort a pending reconfigure request. The second effect is that a completed reconfigure request is removed from the queue. Next, in step 568, the value of the variable I is incremented by one. From step 568, control returns to step 564.

If the value of the variable I is greater than or equal to the parameter EXPAND_UNIT_COUNT, control proceeds to step 572, where it is determined if the value of the parameter EXPAND_UNIT_COUNT is greater than the value zero. If so, control proceeds to step 574, where the parameter EXPAND_NEEDED is set to the TRUE state. If not, control proceeds to step 576, where the parameter EXPAND_NEEDED is set to the FALSE state. From either step 574 or 576, control proceeds to step 578, where it is determined if at least one match occurred (i.e., an entry was removed from the expand request queue) and the parameter EXPAND_NEEDED is false. If so, control proceeds to step 580, where the portion of the write-posting cache 136 allocated to the reconfigure process is freed up for use by other logical requests. From step 580, or from step 578 if the condition of step 578 is not true, control proceeds to step 581, where it is determined if the first entry of the queue was removed or if the parameter EXPAND_NEEDED is false. If either is true, control proceeds to step 582, where the parameter EXPAND_RUNNING is set false. If the condition in step 581 is not true, then control proceeds to step 585.

From step 582, control proceeds to step 582, where the RIS parameters are saved back into the reserved information sectors of the destination logical volume. From step 583, control proceeds to step 584, where the current values of the XP parameters are written to the configuration area of the write-posting cache 136. From step 584, control proceeds to step 585, where an interrupt is sent back to the host to indicate completion of the host request. From step 585, control returns to the calling program.

Figure 7A:
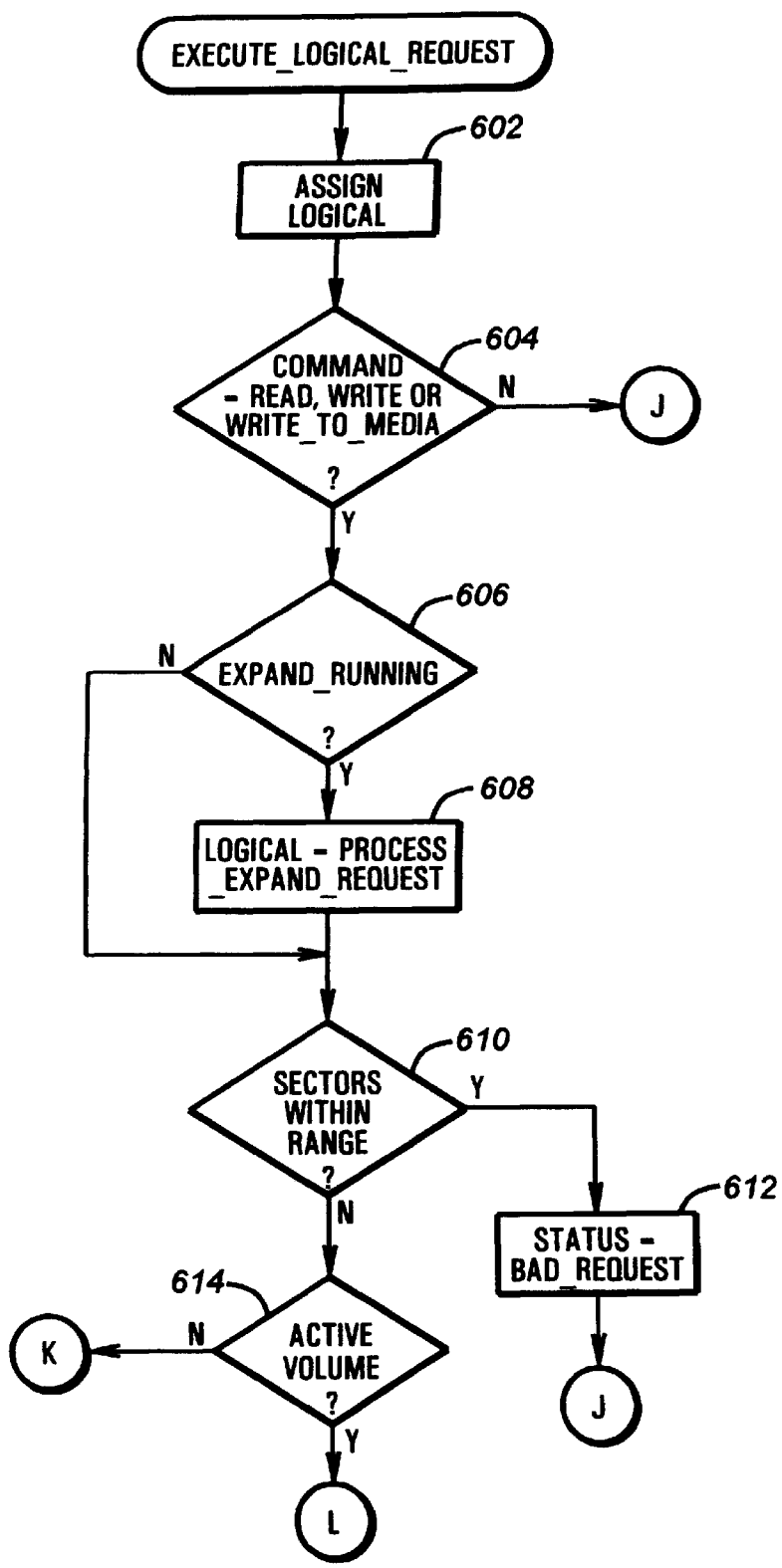
FIGS. 7A–7B are a flow diagram of a routine for handling logical requests.
Figure 7B:
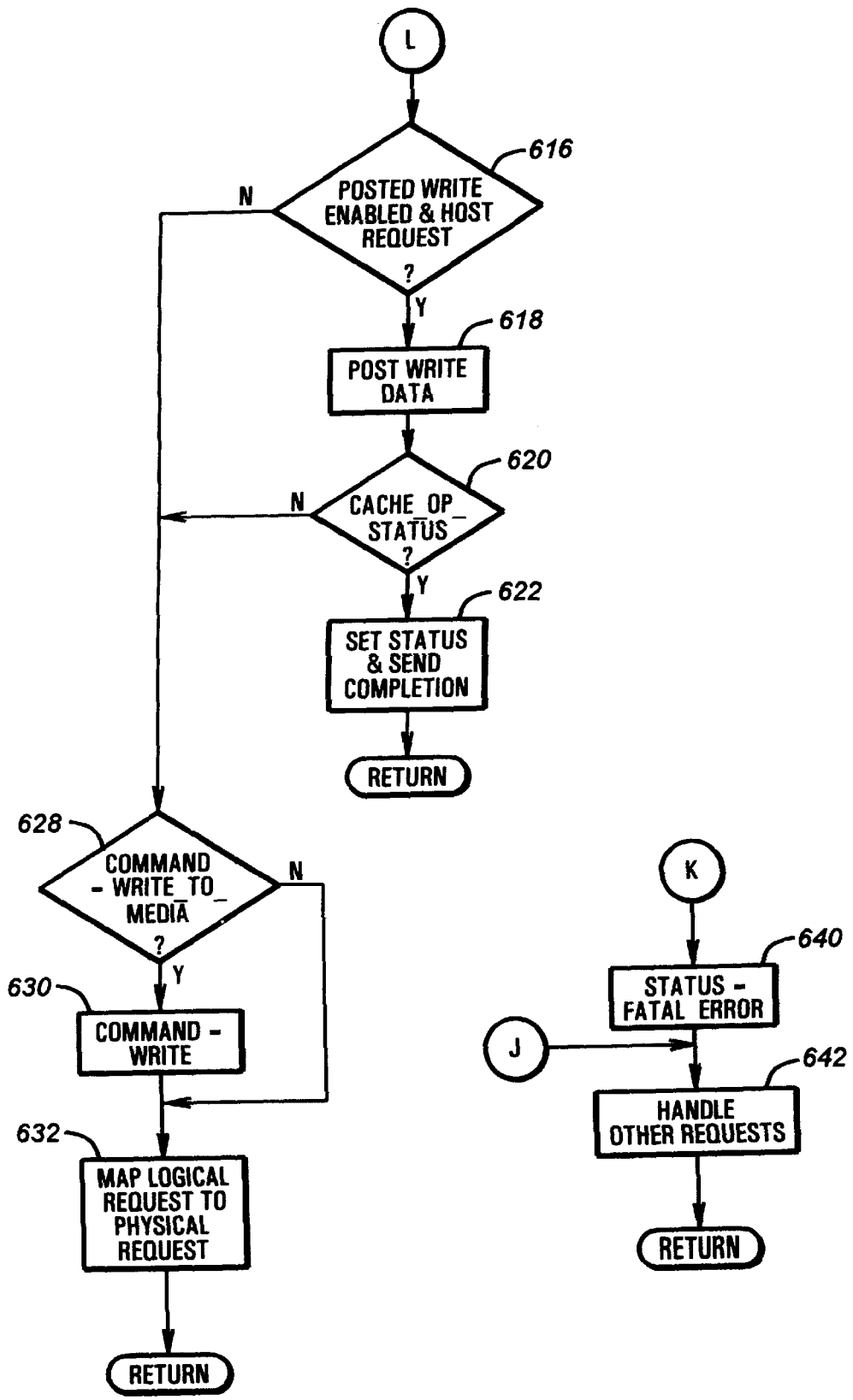

Referring now to FIGS. 7A–7B, a flow diagram is shown of the routine EXECUTE_LOGICAL_REQUEST. The logical request information is contained in a data structure pointed to by the parameter REQUEST. For purposes of the EXPAND task, the logical request information is passed by pointer parameter EXPAND_LOGICAL, i.e., REQUEST= EXPAND_LOGICAL. Read and write requests from the host are handled also by the routine EXECUTE_ LOGICAL_REQUEST while the EXPAND task is performing an on-line disk array reconfiguration. Depending upon where the EXPAND task has progressed, the proper configuration parameters are selected to access the desired locations in the proper logical volume.

Starting in step 602, the pointer to the configuration information of the logical volume to be accessed is placed into a parameter LOGICAL. As discussed, the configuration information is stored in the global RIS data structure in the local memory 108. Next, in step 604, if it is determined that the COMMAND field of the request is a value representing a read, write, or write-to-media operation, then control proceeds to step 606. Otherwise, control proceeds to step 642 to determine the type of command requested.

In step 606, it is determined if the parameter EXPAND_ RUNNING is set high, indicating that the EXPAND task is current running. If so, control proceeds to step 608, where the parameter LOGICAL is set equal to a parameter returned by a routine PROCESS_EXPAND_REQUEST. The routine PROCESSOR_EXPAND_REQUEST first determines if the requesting routine is the EXPAND task. If so, it checks if a read request or a write request is asserted by the EXPAND task. If a read request is detected, then the parameter LOGICAL is set to point to the configuration information of the source logical volume. This allows the appropriate data to be read from the logical volume and transferred to the allocated area in the write posting cache 136. If a write request is detected by the routine PROCESS_ EXPAND_REQUEST, then the parameter LOGICAL is set to point to the configuration information of the destination logical volume.

If the request is a host write or read request, then the routine PROCESS_EXPAND_REQUEST performs a comparison of the accessed sectors to the sectors already processed by the EXPAND task. Based on this comparison, the source or destination logical volume parameters are used to obtain the correct data.

From step 608, or from step 606 if the parameter EXPAND_RUNNING is low, control proceeds to step 610. In step 610, it is determined if the sector currently accessed by the EXPAND task and total sector count is within range. First, it is determined if a parameter REQUEST.BLOCK_ COUNT is equal to the value zero. The parameter REQUEST.BLOCK_COUNT represents the number of sectors to be worked on in the current stripe. In step 610, it is also determined if a parameter REQUEST.BLOCK, which represents the sector currently accessed, is greater than or equal to the parameter BLOCKS_ON_VOLUME of the specified logical volume. The parameter BLOCKS_ON_ VOLUME represents the total number of sectors in the logical volume. In addition, in step 610, it is determined if the sum of the parameters REQUEST.BLOCK and REQUEST.BLOCK_COUNT is greater than the parameter BLOCKS_ON_VOLUME. That indicates that the ending sector to be accessed by the current logical request would exceed the last sector position allocated to the specified logical volume. If any of the conditions above is true, then control proceeds to step 612, where the STATUS flag of the request is set to the state BAD_REQUEST. From step 612, control proceeds to step 642. If none of the conditions in state 610 are true, then control proceeds from 610 directly to step 614.

In step 614, it is determined if a parameter GLOBAL_ RIS is a non-NULL value, and if the volume state of the specified logical volume is at one of the following active states: LOG_VOL_OK, indicating that the logical drive is operational; LOG_VOL_REBUILDING, indicating that the logical drive is currently rebuilding; LOG_VOL_ NEEDS_REBUILD, indicating that the current logical drive needs to be rebuilt; LOG_VOL_REGENING, indicating that a failed physical drive exists, but that the fault tolerant mode selected enables the failed drive's data to be regenerated; and LOG_VOL_OVERHEATING, indicating that hardware in the system is overheating. If the parameter GLOBAL_RIS is a non-NULL value and the volume state is at any one of the above states, then control proceeds to step 616; otherwise, control proceeds to step 640.

In step 616, it is determined if posted writes to the write posting cache 136 are enabled, and if the REQUEST_TYPE field of the logical request is a host request. For the disk array reconfigure operation, the REQUEST_TYPE field is set to a state that is the OR of states EXPAND_REQUEST, INTERNAL_LOGICAL_REQ, and LOCKED_BY_ ORIGINATOR. Thus, the condition checked for in step 616 will not be satisfied for read and write requests invoked by the EXPAND task. For operations requested by the EXPAND task, write posting to the cache 136 will not be performed as the data transfers are directly between the cache 136 and the SCSI controllers 112A–E. If posted writes are not enabled or if the logical request is not a host request, then control proceeds from step 616 to step 628.

If write posting is enabled and the logical request is a host request, control proceeds from step 616 to step 618, where write posting to the cache 136 is performed. From step 618, control proceeds to step 620, where it is determined if a status parameter CACHE_OP_STATUS is equal to zero. If the status parameter CACHE_OP_STATUS is equal to zero, then that indicates that the write posting did not occur for some reason, in which case control proceeds to step 628. If the status CACHE_OP_STATUS parameter is a nonzero value, then control proceeds to step 622, where the STATUS field of the logical request is set to the appropriate state and a completion message is sent back to the host software telling it that the logical request has completed. Thus, as noted earlier, when the host performs a write to the disk array subsystem 142, posting the write data into the write posting cache 136 allows a completion signal to be sent back to the host much sooner than if the write had occurred to the hard disk subsystem 142. From step 622, control returns to the calling program.

In step 628, if it is determined that the COMMAND field of the logical request is a write-to-media command, control proceeds to step 630, where the parameter REQUEST.COMMAND is modified to state WRITE. Control proceeds next to step 632. If the request is not a write-to-media command, then control proceeds from step 628 to step 632. In step 632, the logical request is mapped to a physical request to transfer data to and from the physical disk drives in the disk subsystem 142. The mapping depends on the data distribution mode selected and the fault tolerance mode selected. In the preferred embodiment, the mapping scheme varies between direct mapping, multiple block interleave mapping and parity mapping. The fault tolerance mode can be set to either no fault tolerance, mirror or RAID 1 fault tolerance, RAID 4 fault tolerance or RAID 5 fault tolerance. It is noted that for a reconfigure operation, different fault tolerance modes can be specified for the destination and source logical volumes. The logical requests are mapped to physical requests, with the local processor 106 building a command list in the local memory 108. At some future point in time, the local processor 106 writes a pointer to the command list to the appropriate CDBs are written to the appropriate one of the SCSI controllers 112A–E, which in response obtains control of the PCI bus 102 to fetch the physical commands from the local memory 108. From step 632, control returns to the calling program.

If in step 614, the parameter GLOBAL_RIS is a NULL value or the volume state of the specified logical drive is not in one of the listed states, control proceeds to step 640. In step 640, the STATUS flag of the logical request is set to the state FATAL_ERROR. Control then proceeds from step 640 to step 642, where logical requests other than read, write, or write-to-media requests are handled. From step 642, control returns to the calling program.

Figure 8:
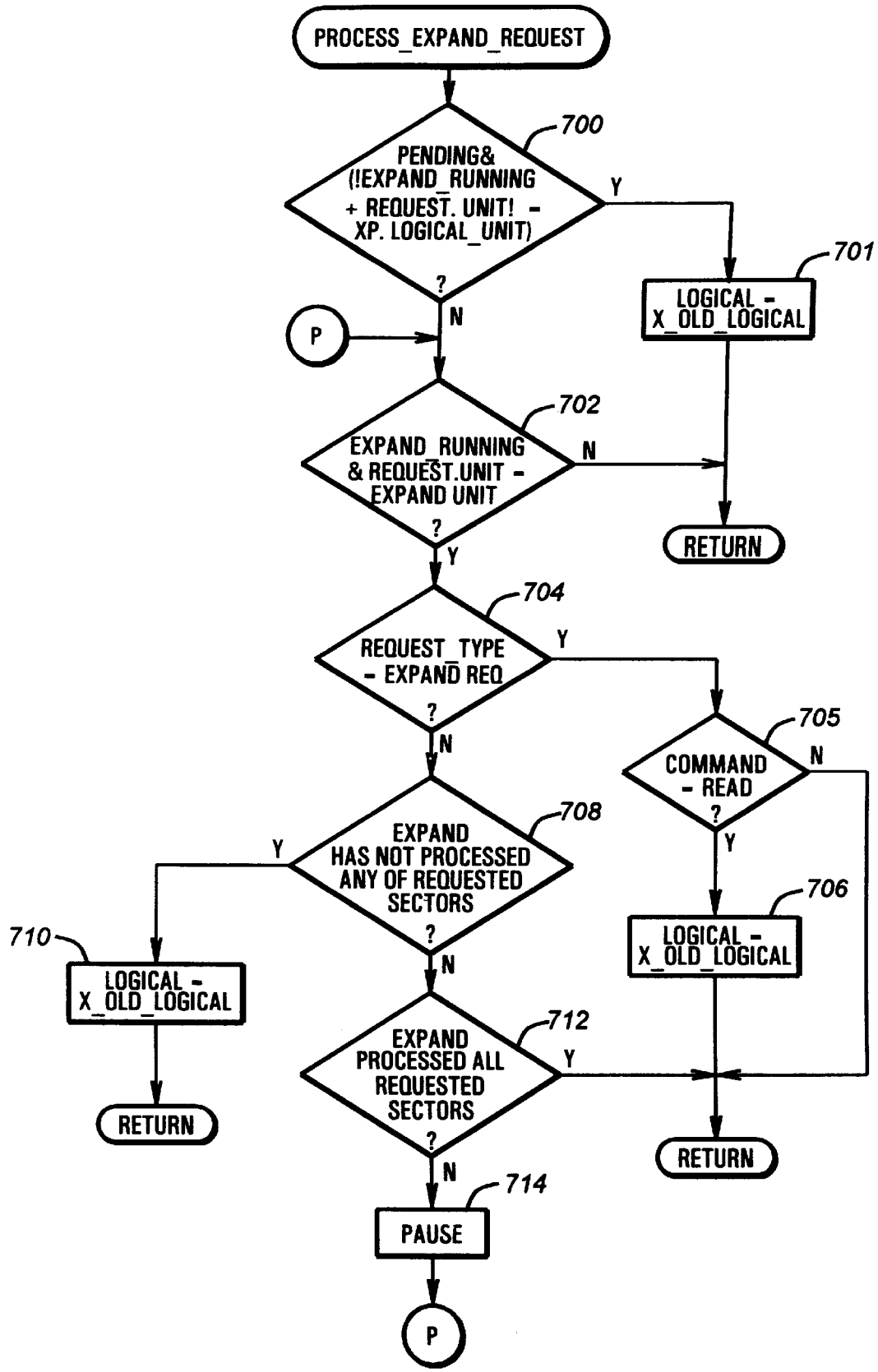
FIG. 8 is a flow diagram of a routine for determining to which logical volume a logical request is directed.

Referring now to FIG. 8, a flow diagram is shown of the routine PROCESS_EXPAND_REQUEST. Beginning in step 700, it is determined if the requested logical volume is pending in the reconfiguration queue. It is also determined if the parameter EXPAND_RUNNING is at the false state or if the requested logical volume is pending in the queue but not yet being processed by the current reconfiguration operation. If one of the above combination of conditions is true, then control proceeds to step 701, where the parameter LOGICAL is set to point to the old configuration information of the requested logical volume. From step 701, control returns to the calling program.

If the conditions in step 700 are not true, then control proceeds to step 702. In step 702, if it is determined that the parameter EXPAND_RUNNING is set high and the volume unit REQUEST.UNIT is equal to the expand logical volume unit XP.LOGICAL_UNIT, control proceeds to step 704. Otherwise, the requested logical volume is not currently being processed by the EXPAND task and control returns to the calling program with the status of the parameter LOGICAL unchanged. In step 704, it is determined if the parameter REQUEST.REQUEST_TYPE indicates a reconfigure request. If so, control proceeds to step 705, where it is determined if the requested command is a read command. If so, control proceeds to step 706, where the parameter LOGICAL is set to the value of the parameter X.OLD_LOGICAL to point to the configuration parameters of the source logical volume. If the requested command is not a read, then control returns from step 705 with the parameter LOGICAL unchanged. From step 706, control returns to the calling program.

In step 704, if the request is not a reconfigure request, i.e., it is a write or read request from the host, control proceeds to step 708, where it is determined if the EXPAND task has reached the requested sector. While the reconfigure process is in progress, read and write requests submitted by the host to either the old logical volume or the new logical volume are allowed. Also allowed are cache flush requests, where the dirty lines in the write posting cache 136 are flushed back into the disk subsystem 142. To ensure that the transfer of data is to the correct locations in the disk subsystem 142, it must be determined whether the sectors accessed by the logical request is to a region already reconfigured by the EXPAND task. Thus, if the requested blocks have already been processed by the EXPAND task, the destination logical volume configuration is used. On the other hand, if the requested blocks have not yet been accessed by the EXPAND task, the source logical volume configuration is used. There is also the possibility that the logical request may request blocks that span both the destination and source logical volumes. In that case, the logical request is suspended until the EXPAND task is able to catch up to the blocks requested.

Thus, in step 708, if the parameter XP.DIRECTION_UP is set high, indicating that the EXPAND task is moving in the forward direction, it is determined if the parameter REQUEST.BLOCK is greater than or equal to the sum of the parameters XP.CURRENT_BLOCK and XP.COUNT. This indicates that the starting sector of the logical request is ahead of sectors that have been processed by the EXPAND task, i.e., the sectors have not yet been accessed by the EXPAND task. If the parameter XP.DIRECTION_UP is set low, however, it is determined if the sum of the parameters REQUEST.BLOCK and REQUEST.BLOCK_COUNT is less than or equal to the parameter XP.CURRENT_BLOCK. This indicates that the ending sector of the logical request is ahead of the EXPAND task. If either of the above conditions is true, control proceeds to step 710, where the parameter LOGICAL is set to point to the configuration information of the source logical volume. From step 710, control returns to the calling program.

If the conditions in 708 are not true, control proceeds to step 712, where it is determined if the EXPAND task has already handled the sectors requested by the logical request. First, if the parameter XP.DIRECTION_UP is set high, then it is determined if the sum of the parameters REQUEST.BLOCK and REQUEST.BLOCK_COUNT is less than or equal to the value of the parameter XP.CURRENT_BLOCK. This indicates that the ending sector of the logical request has already been processed by the EXPAND task. In the alternative, if the parameter XP.DIRECTION_UP is set low, indicating that the EXPAND task is proceeding in the reverse direction, it is determined if the parameter REQUEST.BLOCK is greater than or equal to the sum of the parameters XP.CURRENT_BLOCK and XP.COUNT. This indicates that the starting sector of the logical request has already been processed by the EXPAND task. If either of the above conditions is true, control returns to the calling program leaving the parameter LOGICAL unchanged. It is noted that the state of the parameter LOGICAL is unchanged as it already points to the source logical volume.

If none of the conditions in step 712 are true, control proceeds to step 714, indicating that the blocks requested by the logical request span both the source and destination logical volumes. In step 714, the logical request submitted by the host is suspended for a predetermined period, preferably 0.1 seconds, to allow the EXPAND task to catch up. From step 714, control returns to step 702.

Figure 9:
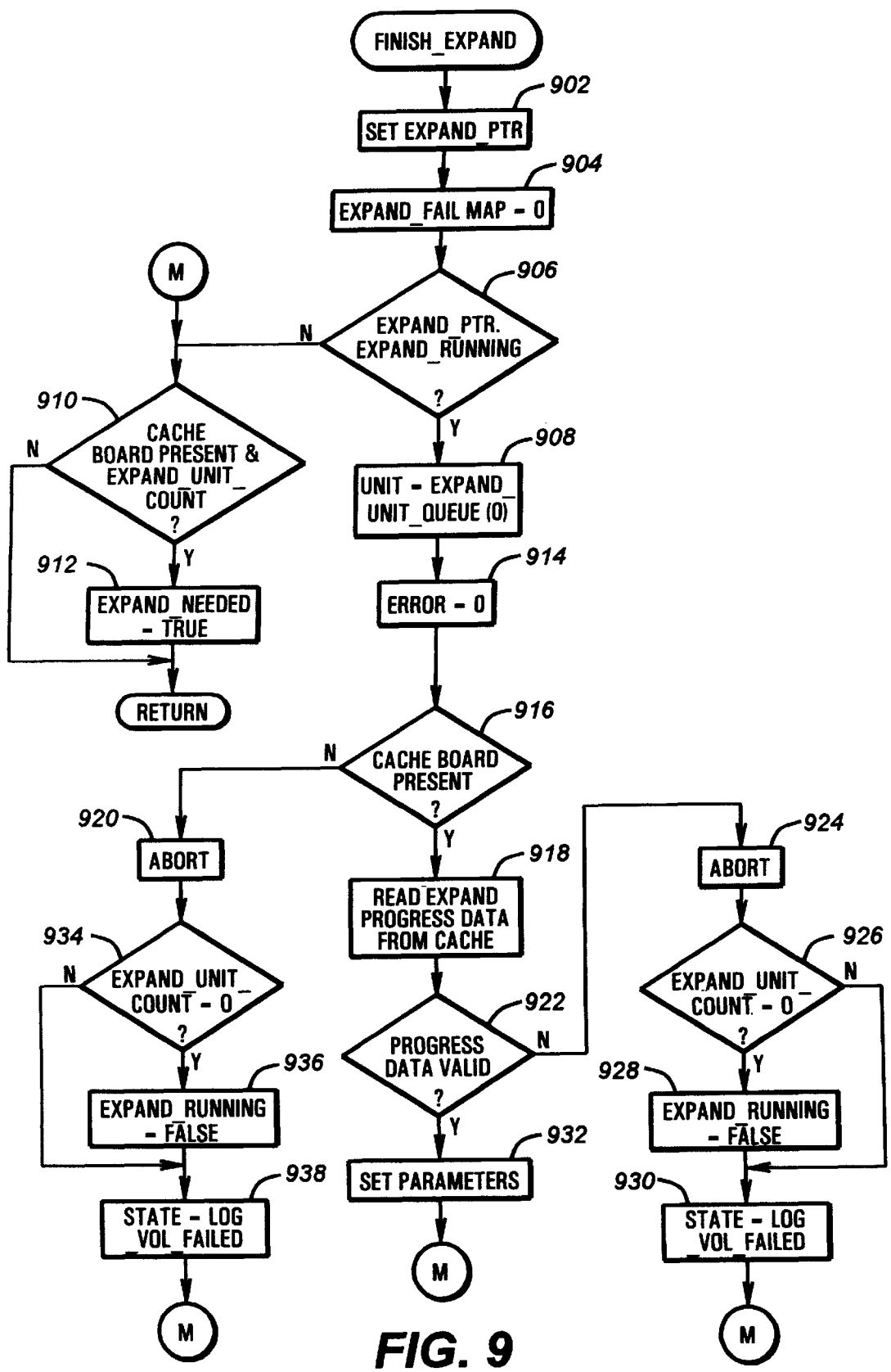
FIG. 9 is a flow diagram of a routine for resuming a reconfigure operation interrupted by power loss.

Referring now to FIG. 9, a flow diagram is shown of a routine FINISH_EXPAND. The routine FINISH_EXPAND is invoked at power up. As noted earlier, portions of the write posting cache 136 are battery backed in case of power failure. As noted above, a configuration area for storing the parameters associated with the volume expand task is allocated in the write posting cache 136, with the expand parameters updated from time to time to keep track of where EXPAND task is. Thus, when a power failure occurs, the disk array reconfigure progress information is not lost and can be retrieved to continue the expand process.

Starting in step 902, a pointer EXPAND_PTR is set equal to the parameter EXPAND in the global RIS data structure. Next, in step 904, the expand failure map EXPAND_FAILURE_MAP is cleared to the value 0. Next, if the parameter EXPAND_RUNNING pointed to by the pointer EXPAND_PTR is true, then control proceeds to step 908 to continue the reconfigure process. Otherwise, control proceeds to step 910. In step 908, the parameter UNIT is set equal to the entry in the expand queue EXPAND_UNIT_QUEUE[0]. Proceeding next to step 914, an error flag ERROR is set to 0.

In step 916, if it is determined that the cache board containing the DRAM interface 118 and the DRAM 116 is present, control proceeds to step 918. Otherwise, control proceeds to step 920. If the cache board is present, the various progress data associated with the EXPAND task is retrieved from the configuration area of the write posting cache 136. As discussed above, the progress data associated with the EXPAND task is stored in the data structure pointed to by the parameter XP. Next, in step 922, it is determined if the progress data is valid. If not, control proceeds to step 924, where the EXPAND task is aborted. From step 924, control proceeds to step 926, where it is determined if the parameter EXPAND_UNIT_COUNT is equal to 0. If so, control proceeds to step 928, where the parameter EXPAND_RUNNING is set to the FALSE state. Control proceeds next to step 930. If the parameter EXPAND_UNIT_COUNT is not equal to the value 0, then control proceeds from step 926 to 930. In step 930, the state of the logical volume is set to the failing state LOG_VOL_FAILED. From step 930, control proceeds to step 910.

If in step 922, it is determined that the reconfigure progress data stored in the configuration are of the write posting cache 136 are valid, then control proceeds to step 932, where the parameter X_OLD_LOGICAL is set to point to the configuration information of the source logical volume. Also in step 932, the parameter EXPAND_NEEDED is set to the TRUE state and the parameter EXPAND_RUNNING is set to the state of the parameter XP.RUNNING. From state 932, control proceeds to step 910.

If the cache board is detected as not being present in step 916, control proceeds to step 920, where the reconfigure process is aborted. Proceeding next to step 934, if it is determined that the parameter EXPAND_UNIT_COUNT is equal to 0, indicating that there are no reconfigure requests in the expand queue, then control proceeds to step 936. In step 936, the parameter EXPAND_RUNNING is set to the FALSE state. From step 936, or from step 934 if the parameter EXPAND_UNIT_COUNT is a non-zero value, control proceeds to step 938, where the state of the logical volume is set to the failure state LOG_VOL_FAILED. From step 938, control proceeds to step 910.

If an EXPAND task was not interrupted by a power failure, it must nevertheless be determined if disk array reconfiguration is needed at power up. Thus, in step 910, if the cache board is detected as being present and the parameter EXPAND_UNIT_COUNT is a nonzero value, then control proceeds to step 912, where the parameter EXPAND_NEEDED is set to the true state. From step 912, or from step 910 if the conditions are not satisfied, control returns to the calling program.

If the reconfiguration operation is an disk array expand operation in which a physical drive is added to the disk array, excess space will be available for a new logical volume after the original data has been spread across the disk drives. The new logical volume can be configured by issuing the SET CONFIGURATION command with its associated parameters. The parameter OFFSET_TO_DATA is set to specify the offset into each drive in the disk array to the new logical volume, which will be after the starting offset of the destination volume. Refer to the discussion of the SET CONFIGURATION command above for some of the other parameters that are involved.

As explained above, the host operating system receives an indication via an interrupt when a disk array has been reconfigured and when a new logical volume has been configured. The EXPAND task at step 562 (FIG. 6C) invokes an interrupt to indicate the completion of the reconfigure operation, and the SET_CONFIGURATION task invokes an interrupt at step 362 (FIG. 3C) to indicate the creation of a new volume. Software running on the host computer system 100 can retrieve the status of a logical volume by issuing a SENSE LOGICAL DRIVE STATUS command, which returns the state of the logical drive, e.g., LOG_VOL_OK, LOG_VOL_FAILED, LOG_VOL_EXPANDING, etc.

Thus, a system has been described in which on-line reconfiguration of a disk array can be achieved. Disk array reconfiguration is invoked if a new physical drive is inserted, or a drive is removed. Reconfiguration can also be performed if the user desires to change the configuration of a particular logical volume, such as its stripe size. The reconfiguration is run as a background task by firmware on a disk controller board. The reconfiguration task first moves data from the source logical volume to a posting memory such as RAM memory. The reconfiguration task operates one stripe at a time, with the stripe size being that of the destination logical volume. Once a stripe of data is moved into the posting memory, it is written back to corresponding locations in the destination logical volume. The reconfiguration process continues until all data in the source logical volume have been moved into the destination logical volume. While the reconfiguration task is working on a particular logical volume, data remains accessible to host write and read requests.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

In the claims:

1. A method of passing host requests to a disk array while reconfiguring the disk array, the disk array having a source logical volume and a destination logical volume, pre-reconfiguration data being associated with the source logical volume and post-reconfiguration data being associated with the destination logical volume, comprising the steps of:

detecting if a host request to the drive array corresponds to post-reconfiguration data or pre-reconfiguration data;

issuing the host request to the source logical volume if the host request corresponds to the pre-reconfiguration data; and issuing the host request to the destination logical volume if the host request corresponds to post-reconfiguration data.

2. The method of claim 1, further comprising the steps of:

detecting if the host request corresponds to post-reconfiguration data and pre-reconfiguration data; and suspending the host request if the host request corresponds to post-reconfiguration data and pre-reconfiguration data.

3. A disk controller for passing host requests to a drive array while reconfiguring the drive array, the drive array having a source logical volume and a destination logical volume, pre-reconfiguration data being associated with the source logical volume and post-reconfiguration data being associated with the destination logical volume, comprising:

detector logic for detecting if a host request to the disk array corresponds to post-reconfiguration data or pre-reconfiguration data;

issuer logic for issuing the host request to the source logical volume if the host request corresponds to pre-reconfiguration data; and issuer logic for issuing the host request to the destination logical volume if the host request corresponds to post-reconfiguration data.

4. The disk controller of claim 3, further comprising:

detector logic for detecting if the host request corresponds to post-reconfiguration data and pre-reconfiguration data; and suspension logic for suspending the host request if the host request corresponds to post-reconfiguration data and pre-reconfiguration data.

5. A computer system, comprising:

a host computer;

a disk drive array, the drive array having a source logical volume and a destination logical volume, pre-reconfiguration data being associated with a source logical volume and post-reconfiguration data being associated with the destination logical volume; and a disk controller for transferring data between the disk array and the host computer, the disk controller comprising:

detector logic for detecting of a host request to the disk array corresponds to post-reconfiguration data or pre-configuration data;

issuer logic for issuing the host request to the source logical volume if the host request corresponds to pre-reconfiguration data; and issuer logic for issuing the host request to the destination logical volume if the host request corresponds to post-reconfiguration data.

6. The computer system of claim 5, the disk controller further comprising:

detector logic for detecting if the host request corresponds to post-reconfiguration data and pre-reconfiguration data; and suspension logic for suspending the host request if the host request corresponds to post-reconfiguration data and pre-reconfiguration data.

7. A processor readable medium storing code for performing the steps comprising:

detecting if a host request to the drive array corresponds to post-reconfiguration data or pre-reconfiguration data;

issuing the host request to a source logical volume if the host request corresponds to the pre-reconfiguration data; and issuing the host request to a destination logical volume if the host request corresponds to post-reconfiguration data.

8. The processor readable medium of claim 7, the code further performing steps comprising:

detecting if the host request corresponds to post-reconfiguration data and pre-reconfiguration data; and suspending the host request if the host request corresponds to post-reconfiguration data and pre-reconfiguration data.

9. A processor readable medium, comprising:

detector code for detecting if a host request to a disk array corresponds to post-reconfiguration data or pre-reconfiguration data;

issuer code for issuing the host request to a source logical volume if the host request corresponds to pre-reconfiguration data; and issuer code for issuing the host request to a destination logical volume if the host request corresponds to post-reconfiguration data.

10. The processor readable medium of claim 9, further comprising:

detector code for detecting if the host request corresponds to post-reconfiguration data or pre-reconfiguration data; and suspension code for suspending the host request if the host request corresponds to post-reconfiguration data and pre-reconfiguration data.

* * * * *